(12) United States Patent
Shen et al.

(10) Patent No.: US 11,538,926 B2
(45) Date of Patent: Dec. 27, 2022

(54) SEMICONDUCTOR DEVICE AND METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Yu-Cheng Shen, Hsinchu (TW); Guan-Jie Shen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 35 days.

(21) Appl. No.: 16/837,908

(22) Filed: Apr. 1, 2020

(65) Prior Publication Data

US 2021/0313454 A1 Oct. 7, 2021

(51) Int. Cl.
*H01L 21/02* (2006.01)
*H01L 29/66* (2006.01)
*H01L 29/78* (2006.01)
*H01L 21/8234* (2006.01)

(52) U.S. Cl.
CPC .. *H01L 29/66795* (2013.01); *H01L 21/02183* (2013.01); *H01L 21/02186* (2013.01); *H01L 21/02194* (2013.01); *H01L 21/823431* (2013.01); *H01L 29/785* (2013.01)

(58) Field of Classification Search
CPC ............. H01L 29/66795; H01L 29/785; H01L 21/02183; H01L 21/02186; H01L 21/02194; H01L 21/823431
See application file for complete search history.

(56) References Cited

U.S. PATENT DOCUMENTS

| 10,049,940 | B1* | 8/2018 | Chen ................. H01L 23/53266 |
| 10,720,431 | B1* | 7/2020 | Cheng ............... H01L 29/66469 |
| 2015/0061041 | A1 | 3/2015 | Lin et al. |
| 2016/0379831 | A1 | 12/2016 | Yeo et al. |
| 2017/0076995 | A1 | 3/2017 | Chang et al. |
| 2018/0026112 | A1 | 1/2018 | Park et al. |
| 2018/0166274 | A1* | 6/2018 | Lin .................... H01L 21/02326 |
| 2019/0371675 | A1* | 12/2019 | Tsai ................ H01L 21/823431 |
| 2021/0035989 | A1* | 2/2021 | Lee .................... H01L 29/66545 |

FOREIGN PATENT DOCUMENTS

| CN | 105304565 B | 3/2018 |
| KR | 10-2017-0002265 A | 1/2017 |

* cited by examiner

*Primary Examiner* — David Vu
*Assistant Examiner* — Brandon C Fox
(74) *Attorney, Agent, or Firm* — McDermott Will & Emery LLP

(57) ABSTRACT

A method of manufacturing a semiconductor device includes forming a plurality of work function metal layers and an oxygen absorbing layer over a channel region of the semiconductor device, including forming a first work function metal layer over the channel region, forming an oxygen absorbing layer over the first work function metal layer, forming a second work function metal layer over the oxygen absorbing layer. A gate electrode metal layer is formed over the plurality of work function metal layers. The work function metal layers, oxygen absorbing layer, and gate electrode metal layer are made of different materials.

20 Claims, 20 Drawing Sheets

| | P1 | P2 | P3 | N1 | N2 | N3 |
|---|---|---|---|---|---|---|
| | 80 | 80 | 80 | 80 | 80 | 80 |
| | 105 | 105 | 105 | 105 | 105 | 105 |
| | 70 | 70 | 70 | 70 | 70 | 70 |

FIG. 7A

| | P1 | P2 | P3 | N1 | N2 | N3 |
|---|---|---|---|---|---|---|
| | 85 | | | | | |
| | 90 | | | | | |
| | 85 | 85 | 85 | | | |
| | 80 | 80 | 80 | 80 | 80 | 80 |
| | 105 | 105 | 105 | 105 | 105 | 105 |
| | 70 | 70 | 70 | 70 | 70 | 70 |

FIG. 7B

SEMICONDUCTOR DEVICE AND METHOD OF MANUFACTURING A SEMICONDUCTOR DEVICE

BACKGROUND

With increasing down-scaling of integrated circuits and increasingly demanding requirements of speed of integrated circuits, transistors need to have higher drive currents with increasingly smaller dimensions. Fin field-effect transistors (FinFET) were thus developed. FinFETs include vertical semiconductor fins above a substrate. The semiconductor fins are used to form source and drain regions, and channel regions between the source and drain regions. Shallow trench isolation (STI) regions are formed to define the semiconductor fins. The FinFETs also include gate stacks, which are formed on the sidewalls and the top surfaces of the semiconductor fins. The gate stack includes multiple layers of dielectric materials and conductive materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 7B, 7C, 7D, 7E and 7F show cross sectional views of various stages of a sequential manufacturing process of a semiconductor device according to embodiments of the present disclosure.

DETAILED DESCRIPTION

Figure 1A:
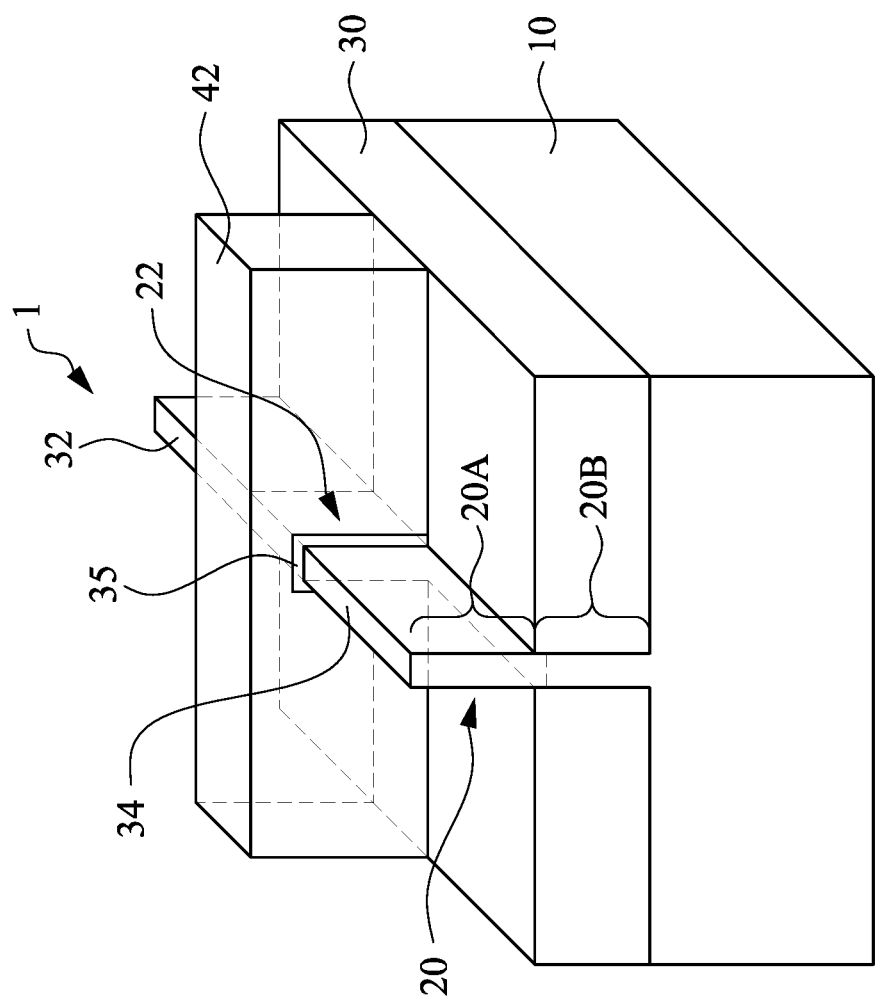
FIG. 1A schematically illustrates a perspective view of an exemplary FinFET device in accordance with some embodiments of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

Disclosed embodiments relate to a semiconductor device, in particular, a gate structure of a field effect transistor (FET) and its manufacturing method. The embodiments such as those disclosed herein are generally applicable not only to planar FETs but also to a fin FET (FinFET), a double-gate FET, a surround-gate FET, an omega-gate FET or a gate-all-around (GAA) FET, and/or nanowire transistors, or any suitable device having one or more work function adjustment metal (WFM) layers in the gate structure.

In FET structures, building multiple threshold voltage (VT) devices with low VT is desirable for low power consumption and improved device performance. Composition and thickness of metal gate films play a crucial role in defining the device work function, VT. Multiple FETs having different threshold voltages can be realized by adjusting materials and/or thicknesses of one or more work function adjustment material layers (WFMs) disposed between a gate dielectric layer and a metal gate electrode layer (e.g., a W layer). A metal gate structure is generally formed by using a gate replacement technology, in which a gate stack is formed in a narrow, high aspect ratio trench (gate space), from which a sacrificial gate structure is removed.

In FET structures, thickening of the gate dielectric layer or interfacial layer may occur during subsequent processing of the semiconductor device. For example, when a metal gate stack is exposed to the atmosphere, such as during a metal gate chemical mechanical polishing (CMP) operation, a work function metal (WFM) could be oxidized and unwanted threshold voltage change could occur. Further, moisture could be driven into the gate dielectric layer or interfacial layer. In addition, any oxygen in a gate stack could penetrate into the gate dielectric layer and the interfacial layer resulting in greater oxidation of these layers and resulting in thickening of the gate dielectric or interfacial layers. Embodiments of the present disclosure address oxidation problems and help prevent oxidation of the work function metal, gate dielectric, and interfacial layers.

FIG. 1A schematically illustrates a perspective view of an exemplary FinFET device 1 in accordance with some embodiments of the present disclosure. The FinFET device 1 includes, among other features, a substrate 10, a fin 20 (e.g., a fin structure), a gate dielectric layer 35 and a gate electrode 42. In some embodiments, the substrate 10 is a silicon substrate. Alternatively, as will be described below, the substrate 10 may include another elementary semiconductor, such as germanium; a compound semiconductor including Group IV-IV compound semiconductors, Group III-V compound semiconductors; or combinations thereof. The fin 20 is disposed over the substrate. The fin 20 may be made of the same material as the substrate 10 and may protrude from the substrate 10. In some embodiments, the fin structure is made of Si. In some embodiments, the substrate 10 is a silicon-on-insulator (SOI) substrate. The fin 20 may be intrinsic and may appropriately be doped with an n-type impurity or a p-type impurity. In some embodiments, source and drain regions 32 and 34 are heavily doped and may contain impurities having a concentration in a range from about $5 \times 10^{19}$ cm$^{-3}$ to $1 \times 10^{20}$ cm$^{-3}$, while a channel region 22, e.g., a gate region, is undoped or lightly doped.

Figure 1B:
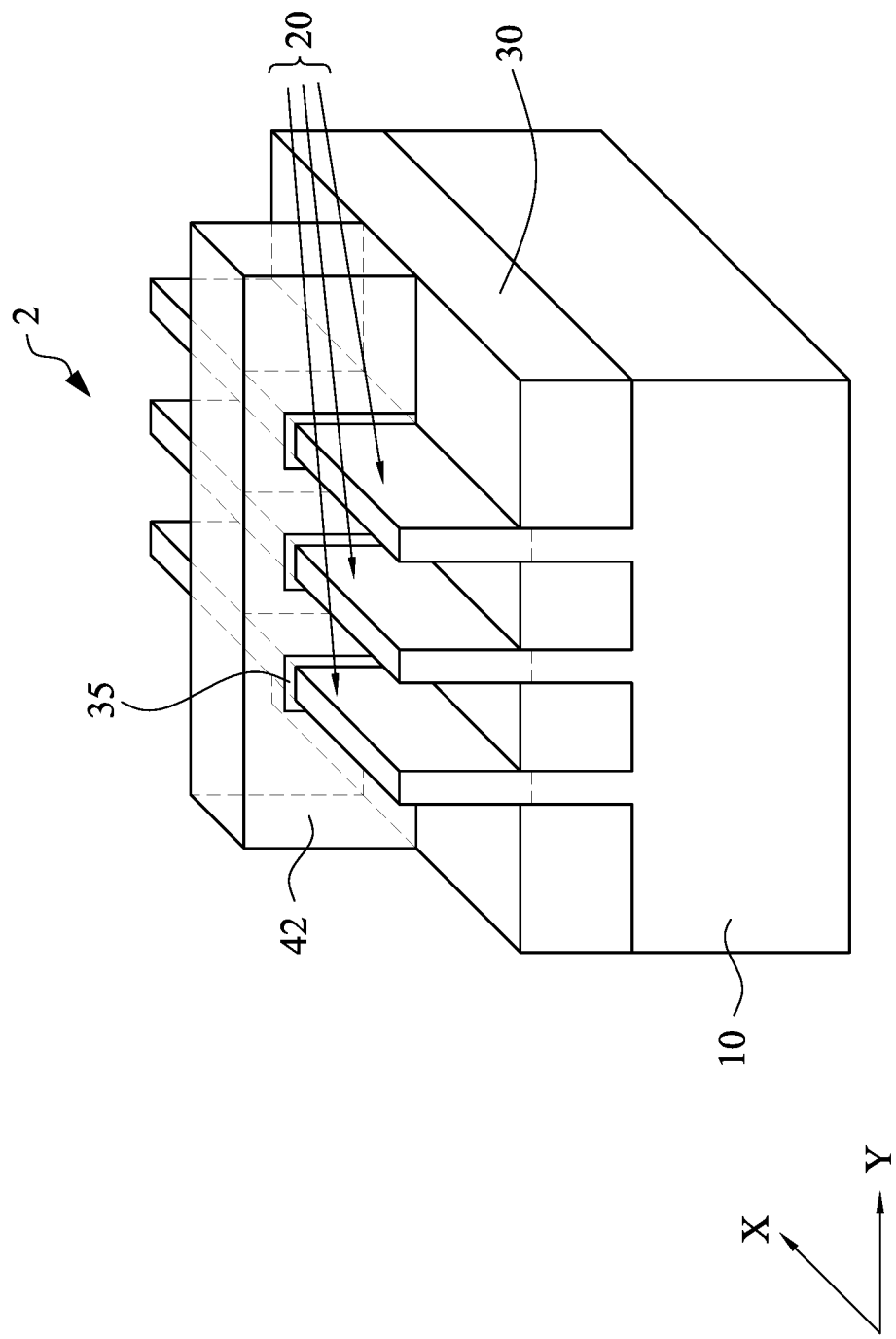
FIG. 1B schematically illustrates a perspective view of an exemplary FinFET device having multiple fins in accordance with some embodiments of the present disclosure.

FIG. 1B schematically illustrates a perspective view of an exemplary FinFET device 2 having multiple fins in accordance with some embodiments of the present disclosure. The FinFET device 2 includes, among other features, a substrate 10, two or more, e.g., three fins 20, gate dielectric layer 35 and gate electrode 42 of FinFET device 1 of FIG. 1A. The fins 20 may protrude from the isolation insulating layer 30. In some embodiments, as shown in FIG. 1B, a single dielectric layer, gate dielectric layer 35, and a single gate electrode 42 cover all three fins 20. The number of the fins 20 is not limited to three.

In some embodiments, the configuration of the FinFET device 1 or the configuration of FinFET device 2 is used as an n-type transistor. In some embodiments, the configuration of the FinFET device 1 or the configuration of FinFET device 2 is used as a p-type transistor. The material for forming the gate electrode layers or thicknesses of corresponding portions of the gate electrode layers of the n-type transistors and the p-type transistors may be different, so as to obtain suitable work function levels for the n-type transistors and the p-type transistors, respectively.

A height of the fin 20 includes an upper part 20A and a lower part 20B. The lower part 20B may be embedded in the isolation insulating layer 30, and the upper part 20A of the fin 20 may protrude from the isolation insulating layer 30. A middle portion of the upper part 20A, along a length of the upper part 20A under the gate electrode 42, is the channel region 22 and the two end regions of the upper part 20A are the source and drain regions 32 and 34. In some examples, a fin structure that includes two or more fins 20 having two or more channels are formed on substrate 10. A FinFET device having two or more channels is described with respect to FIG. 1B. Spaces between the fins 20 and/or a space between one fin structure and another element formed over the substrate 10 are filled by an isolation insulating layer 30. In some embodiments, isolation insulating layer 30 is a "shallow-trench-isolation (STI)" layer filled with an insulating material. The insulating material for the isolation insulating layer 30 may include silicon oxide, silicon nitride, silicon oxynitride (SiON), SiOCN, fluorine-doped silicate glass (FSG), or a low-k dielectric material or other suitable material.

The channel region 22 of the upper part 20A protruding from the isolation insulating layer 30 is covered by a gate dielectric layer 35, and the gate dielectric layer 35 is further covered by a gate electrode 42. Portions of the upper part 20A not covered by the gate electrode 42, e.g., source and drain regions 32 and 34, function as source and drain of a metal oxide semiconductor field effect transistor (MOSFET).

In embodiments of the disclosure, the semiconductor device includes a gate stack (see FIGS. 3A-6) disposed over a channel region of the fin structure 20. The gate stack includes an interfacial layer, a gate dielectric layer, a plurality of work function metal layers, and a gate electrode layer.

In certain embodiments, the gate dielectric layer 35 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode layer 42 is made of one or more layers of suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, or other suitable materials, and/or combinations thereof. In some embodiments, a gate electrode 42 is formed over the channel region 22, and extends to cover sidewalls of the channel region 22 and to cover portions of the isolation insulating layer 30. One or more FinFETs can be fabricated based on the semiconductor fins as shown in FIGS. 1A and 1B.

In some embodiments, one or more work function metal layers (WFM) (see FIGS. 3A-6) are interposed between the gate dielectric layer and the gate electrode. In some embodiments, the WFM layer is made of a conductive material such as a single layer of TiN, WN, TaAlC, TiC, TaAl, TaC, Co, Al, TiAl, or TiAlC, or a multilayer of two or more of these materials. For the n-type FET, an aluminum containing layer, such as TiAl, TiAlC, TaAl and/or TaAlC is used as an n-type WFM layer, and for the p-type FET, one or more of TaN, TiN, WN, TiC, WCN, MoN and/or Co is used as a p-type WFM layer. In some embodiments, an n-type WFM layer is composed of materials having low work function in a range from about 2.5 eV to about 4.4 eV and/or having a low electronegativity. In some embodiments, a p-type WFM layer is composed of materials having a high work function in a range from about 4.3 eV to 5.8 eV and/or having high electronegativity. In some embodiments, the gate stack includes both p-type WFM and n-type WFM layers.

Source and drain regions 32 and 34 that are also formed in the fin 20 are appropriately doped with impurities in the source and drain regions 32 and 34. In some examples, source and drain regions are not part of the fin 20 but are epitaxially grown at the two ends of the fin 20 using appropriate material. An alloy of Si or Ge and a metal such as Co, Ni, W, Ti or Ta, or any other suitable material is formed on the source and drain regions to create source and drain contacts in some embodiments.

FIGS. 2A-2H illustrate various stages of a semiconductor device fabrication process in accordance with some embodiments of the present disclosure. Additional operations can be provided before, during, and after processes shown by FIGS. 2A-2H, and some of the operations described below can be replaced or eliminated, for additional embodiments of the method. The order of the operations/processes may be interchangeable. The operations shown in FIGS. 2A-2H can be used for creating the devices shown in the other figures of the present disclosure.

Figure 2A:
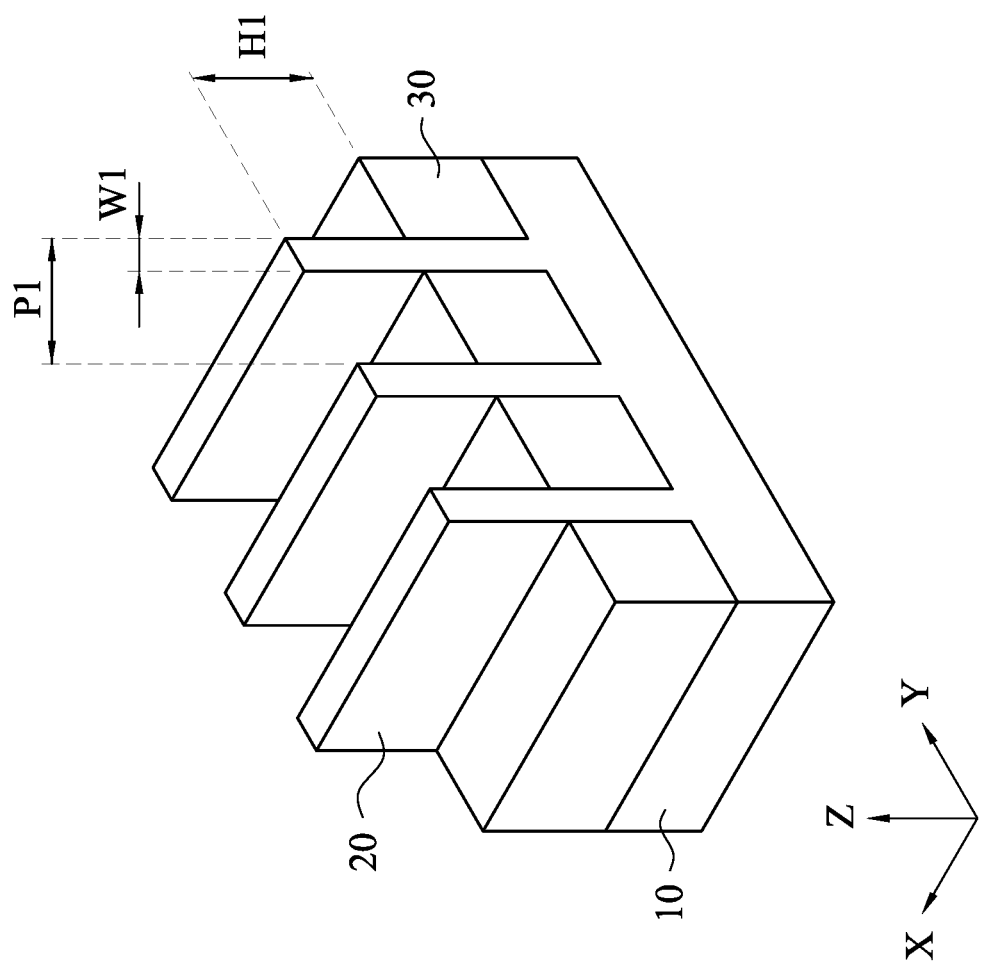
FIG. 2A illustrates one of the various stages of a semiconductor device manufacturing process in accordance with some embodiments of the present disclosure.

First, as shown in FIG. 2A, the fins 20 are formed over the substrate 10 using, for example, a patterning process. The substrate 10 may include various doped regions depending on design requirements (e.g., p-type substrate or n-type substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 10 is made of a suitable elemental semiconductor, such as silicon, diamond or germanium; a suitable alloy or compound semiconductor, such as Group-IV compound semiconductors, such as silicon germanium (SiGe), silicon carbide (SiC), silicon germanium carbide (SiGeC), GeSn, SiSn, and SiGeSn; Group III-V compound semiconductors, such as gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP), or the like. Further, in some embodiments, the substrate 10 includes an epitaxial layer (epi-layer), which may be strained for performance enhancement, and/or may include a silicon-on-insulator (SOI) structure.

The fins 20 are patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The multi-patterning processes combining photolithography and self-aligned processes generally result in forming a pair of fins. In FIG. 2A, three fins 20 are illustrated. However, the numbers of the fins is not limited to three. In some embodiments, one or more dummy fins are formed adjacent to the fins 20 of an active FinFET.

In some embodiments, the entire fins 20 are formed of crystalline Si. In other embodiments, at least a channel region of the fins 20 includes SiGe where a content of Ge is in a range from about 20 atomic % to 50 atomic %. When a SiGe channel is employed, a SiGe epitaxial layer is formed over a substrate 10 and patterning operations are performed. In some embodiments, one or more buffer semiconductor layers having a lower Ge concentration than the channel region are formed over the substrate 10.

After the fins are formed, an isolation insulating layer 30 (e.g., shallow trench isolation (STI)), is disposed over the fins 20 and the substrate 10. Prior to forming the isolation insulating layer 30, one or more liner layers are formed over the substrate 10 and sidewalls of the bottom part of the fins 20, in some embodiments. In some embodiments, the liner layers include a first fin liner layer formed on the substrate 10 and sidewalls of the bottom part of the fins 20, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

In some embodiments, the isolation insulating layer 30 includes one or more layers of insulating materials, for example, silicon dioxide, silicon oxynitride and/or silicon nitride formed by LPCVD (low pressure chemical vapor deposition), plasma-CVD or flowable CVD. In flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 30 is formed by one or more layers of SOG, SiO, SiON, SiOCN or fluorine-doped silicate glass (FSG) in some embodiments.

After forming the isolation insulating layer 30 over the fins 20, a planarization operation is performed so as to remove part of the isolation insulating layer 30. The planarization operation may include a chemical mechanical polishing (CMP) and/or an etch-back process. Subsequently, portions of the isolation insulating layer 30 extending over the top surfaces of the fins 20, and portions of the liner layers over the top surfaces of the fins 20 are removed using, for example, an etch process, chemical mechanical polishing (CMP), or the like. Further, the isolation insulating layer 30 is recessed to expose the upper portion of the fins 20. In some embodiments, the isolation insulating layer 30 is recessed using a single etch process, or multiple etch processes. In some embodiments in which the isolation insulating layer 30 is made of silicon oxide, the etch process is a dry etch, a chemical etch, or a wet cleaning process. In certain embodiments, the partially removing the isolation insulating layer 30 is performed using a wet etching process, for example, by dipping the substrate in hydrofluoric acid (HF). In another embodiment, the partially removing the isolation insulating layer 30 is performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by rapid thermal annealing (RTA) at a temperature in a range of about 900° C. to about 1050° C. for about 1.5 seconds to about 10 seconds in an inert gas ambient, such as an $N_2$, Ar or He ambient.

As shown in FIG. 2A, the fins 20 extend in the X direction and are arranged in the Y direction with an equal pitch P1 in some embodiments. The width W1 of the fins 20 at this stage is in a range of about 5 nm to about 40 nm in some embodiments. In some embodiments, the width W1 of the fins 20 is in a range of about 7 nm to about 15 nm. The height H1 of the fins 20 measured from the upper surface of the isolation insulating layer 30 at this stage is in a range of about 50 nm to about 300 nm in some embodiments. In some embodiments, the height H1 of the fins 20 is in a range of about 50 nm to about 100 nm. The pitch P1 of the fins 20 is in a range of about 10 nm to about 90 nm in some embodiments. In some embodiments, the width of the fins 20 is in a range of about 14 nm to about 45 nm. The space between the fins 20 is in a range of about 5 nm to about 80 nm in some embodiments, and is in a range of about 7 nm to about 15 nm in other embodiments.

Figure 2C:
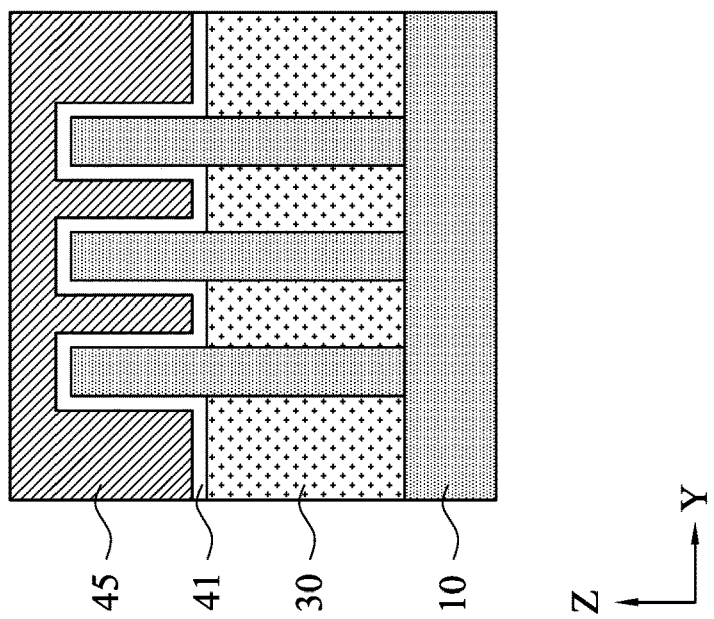
FIGS. 2B and 2C illustrate one of the various stages of a semiconductor device manufacturing process in accordance with some embodiments of the present disclosure.
Figure 2B:
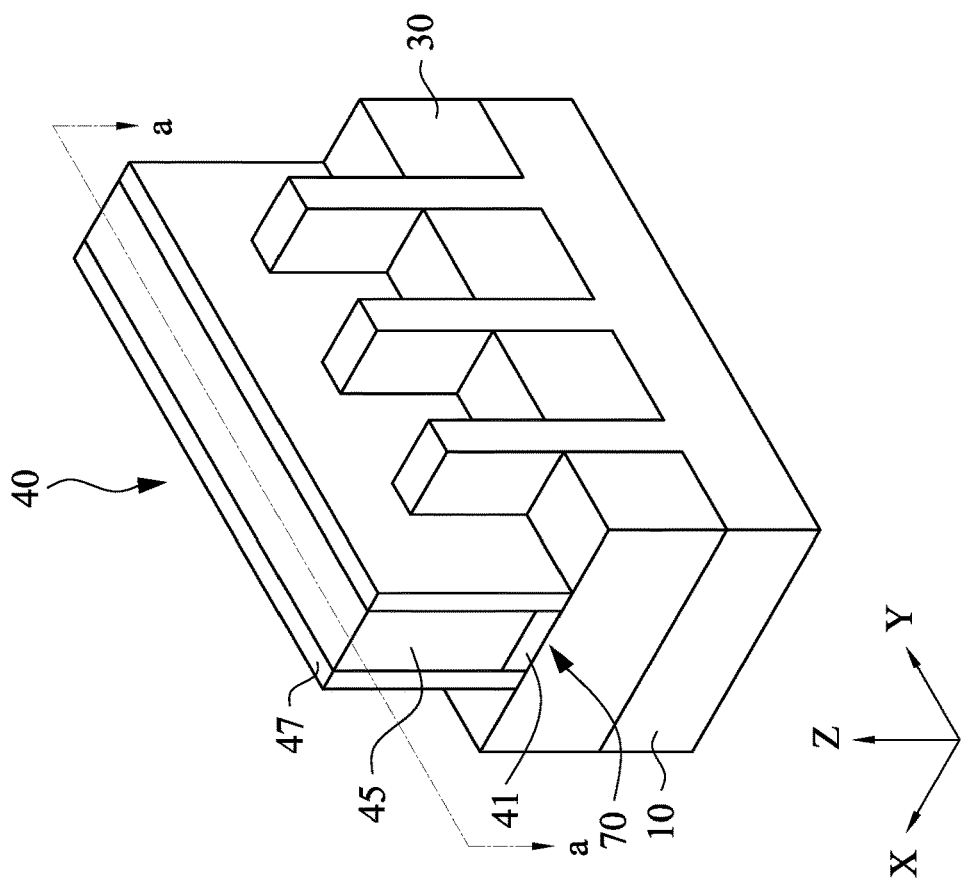

After the fins 20 and the isolation insulating layer 30 are formed, a sacrificial gate structure 40 including a sacrificial gate dielectric layer 41 and a sacrificial gate electrode layer 45 are formed over the exposed fins 20, which are subsequently used as channel layers of a gate region, as shown in FIGS. 2B and 2C. FIG. 2B is a perspective view and FIG. 2C is a cross sectional view corresponding to line a-a of FIG. 2B along the Y direction.

The sacrificial gate dielectric layer 41 and the sacrificial gate electrode layer 45 will be subsequently used to define and form the source/drain regions. In some embodiments, the sacrificial gate dielectric layer 41 and the sacrificial gate electrode layer 45 are formed by first depositing and patterning a sacrificial gate dielectric layer formed over the exposed fins 20 and then a dummy electrode layer over the sacrificial gate dielectric layer. The sacrificial gate dielectric layer 41 may be formed by thermal oxidation, CVD, sputtering, or any other methods known and used in the art for forming a sacrificial gate dielectric layer. In some embodiments, the sacrificial gate dielectric layer 41 is made of one or more suitable dielectric materials such as silicon oxide, silicon nitride, SiCN, SiON, and SiN; low-k dielectrics, such as carbon doped oxides; extremely low-k dielectrics, such as porous carbon doped silicon dioxide; a polymer, such as polyimide; the like, or a combination thereof. In some embodiments, $SiO_2$ is used.

Subsequently, the sacrificial gate electrode layer 45 is formed over the sacrificial gate dielectric layer 41. In some embodiments, the sacrificial gate electrode layer 45 is a conductive material and is selected from a group including amorphous silicon, poly silicon, amorphous germanium, poly germanium, amorphous silicon-germanium, poly silicon-germanium, metallic nitrides, metallic silicides, metallic oxides, and metals. The sacrificial gate electrode layer may be deposited by PVD, CVD, sputter deposition, or other techniques known and used in the art for depositing conductive materials. Other materials, conductive and non-conductive, may be used. In one embodiment, polysilicon is used.

A mask pattern may be formed over the sacrificial gate electrode layer 45 to aid in the patterning. The mask pattern includes a first mask layer and a second mask layer disposed on the first mask layer. The mask pattern includes one or more layers of $SiO_2$, SiCN, SiON, aluminum oxide, silicon nitride, or other suitable materials. In some embodiments, the first mask layer includes silicon nitride or SiON and the second mask layer includes silicon oxide. By using the mask pattern as an etching mask, the dummy electrode layer is patterned into the sacrificial gate electrode layer 45. In some embodiments, the dielectric layer is also patterned to define the sacrificial gate dielectric layer. The fins 20 extend in the X direction and the sacrificial gate structure 40 extends in the Y direction substantially perpendicular to the X direction. In FIGS. 2B and 2C, one sacrificial gate structure is illustrated. However, the number of the sacrificial gate structures is not limited to one.

Further, sidewall spacers 47 are formed on opposing sidewalls of the sacrificial gate structure 40, as shown in FIG. 2B. The sidewall spacers 47 include one or more dielectric layers. In one embodiment, the sidewall spacers 47 are made of one or more of silicon oxide, silicon nitride, SiOCN, SiCN, aluminum oxide, AlCO or AlCN, or any other suitable dielectric material. A blanket layer of a side-wall insulating material may be formed by CVD, PVD, ALD, or other suitable technique. Then, anisotropic etching is performed on the side-wall insulating material to form a pair of side-wall insulating layers (sidewall spacers 47) on two main sides of the gate structure. The thickness of the side-wall insulating layers (sidewall spacers 47) is in a range of about 5 nm to about 30 nm in some embodiments, and in a range of about 10 nm to about 20 nm in other embodiments.

Figure 2D:
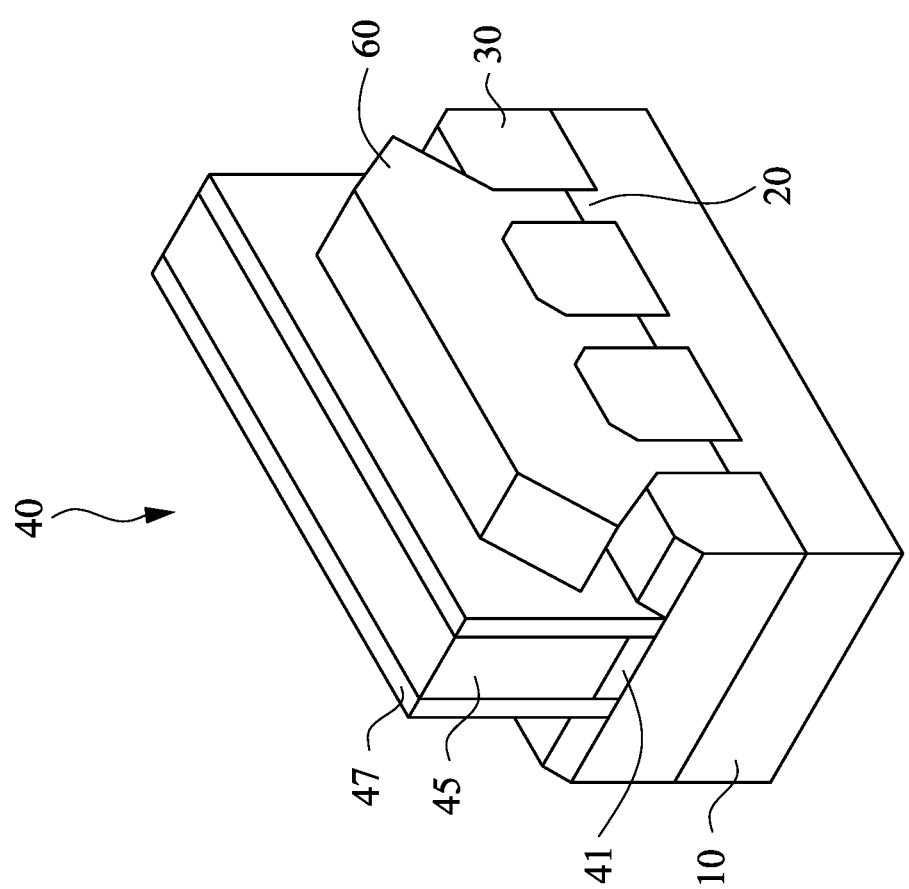
FIG. 2D illustrates one of the various stages of a semiconductor device manufacturing process in accordance with some embodiments of the present disclosure.

Subsequently, the source/drain regions of the fins 20 are recessed down below the upper surface of the isolation insulating layer 30 in some embodiments. Then, a source/drain epitaxial layer 60 is formed over the recessed source/drain regions of the fins 20, as shown in FIG. 2D. In some embodiments, the source/drain epitaxial layer 60 is a merged epitaxial layer as shown in FIG. 2D. In other embodiments, the source/drain epitaxial layer 60 is individually formed over the recessed fins 20 without merging with the adjacent source/drain epitaxial layer.

The materials used for the source/drain epitaxial layer 60 may be varied for the n-type and p-type FinFETs, such that one type of material is used for the n-type FinFETs to exert a tensile stress in the channel region and another type of material is used for the p-type FinFETs to exert a compressive stress. For example, SiP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer 60 includes two or more epitaxial layers with different compositions and/or different dopant concentrations. The source/drain epitaxial layer 60 can be formed by CVD, ALD, molecular beam epitaxy (MBE), or any other suitable methods.

After the source/drain epitaxial layer 60 is formed, an interlayer dielectric (ILD) layer 50 is formed. In some embodiments, before forming the ILD layer, an etch stop layer (ESL) is formed over the source/drain epitaxial layer 60 and sidewall spacers 47. The ESL is made of silicon nitride or a silicon nitride-based material (e.g., SiON, SiCN or SiOCN) in some embodiments. The materials for the ILD layer 50 include compounds comprising Si, 0, C and/or H, such as silicon oxide, SiCOH and SiOC. Organic materials, such as polymers, are used for the ILD layer 50 in some embodiments.

Figure 2F:
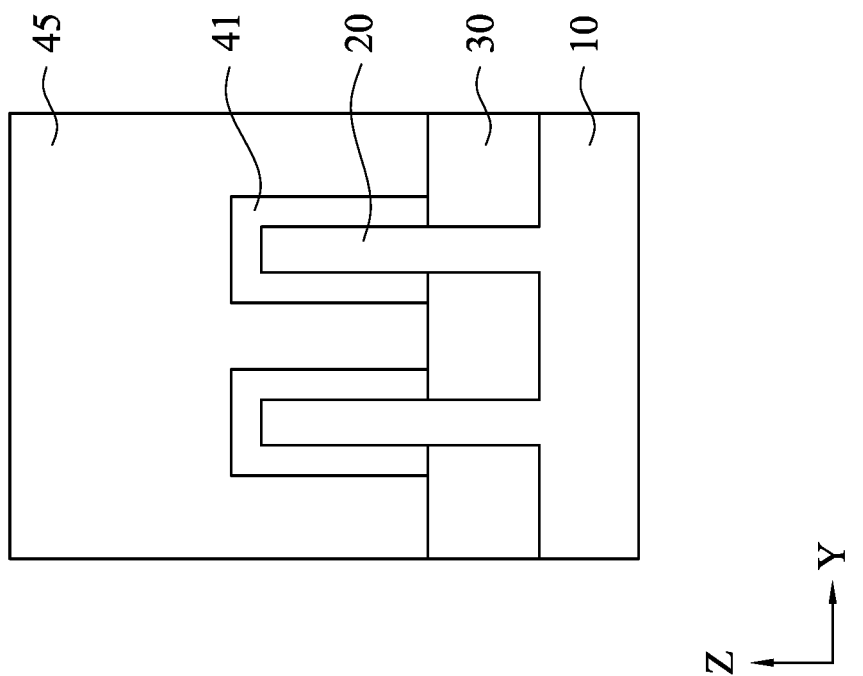
FIGS. 2E and 2F illustrate one of the various stages of a semiconductor device manufacturing process in accordance with some embodiments of the present disclosure.
Figure 2E:
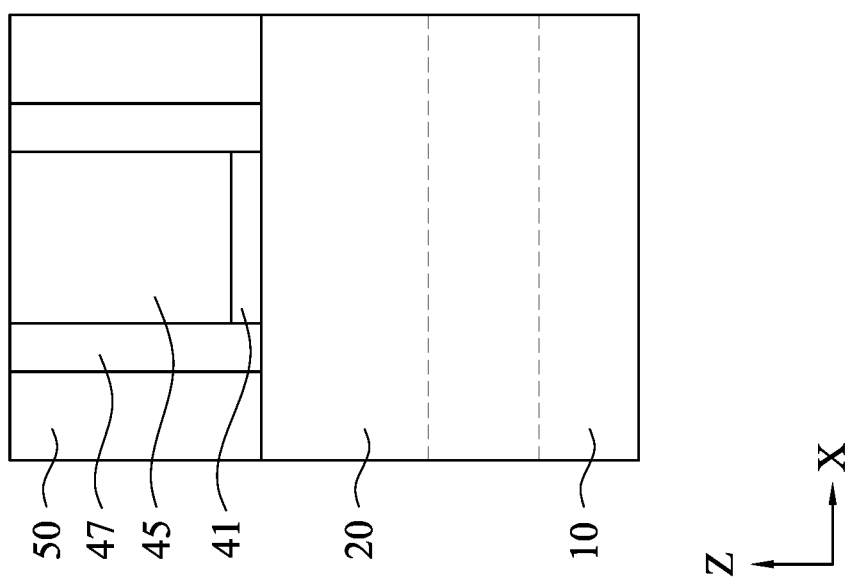
Figure 2H:
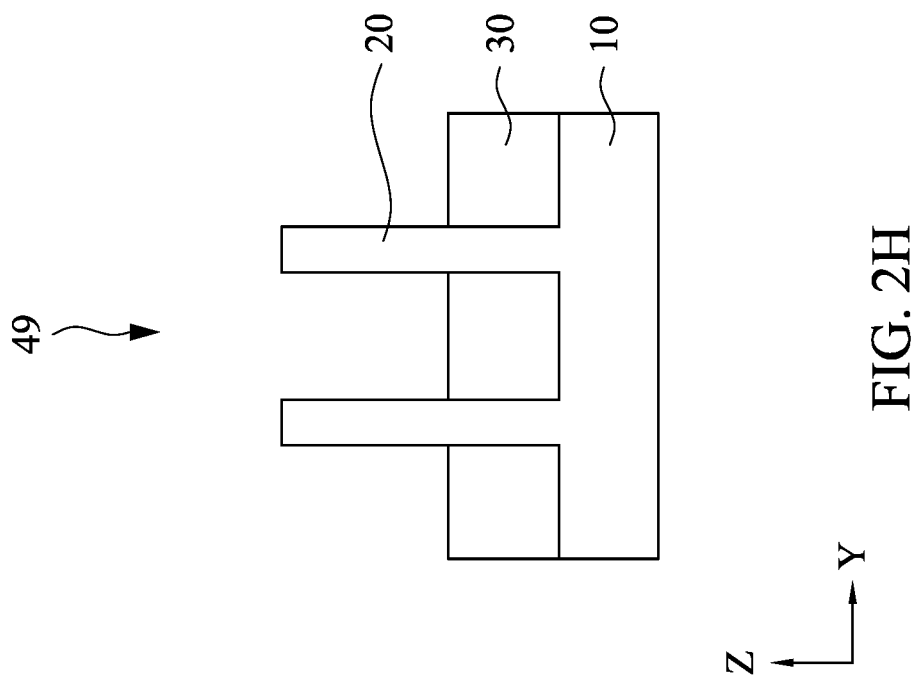
FIGS. 2G and 2H illustrate one of the various stages of a semiconductor device manufacturing process in accordance with some embodiments of the present disclosure.

After the ILD layer 50 is formed, a planarization operation, such as an etch-back process and/or a chemical mechanical polishing (CMP) process, is performed to expose the upper surface of the sacrificial gate electrode layer 45, as shown in FIGS. 2E and 2F. FIG. 2E is a cross sectional view along the X direction, and FIG. 2F is a cross sectional view along the Y direction. In FIGS. 2F and 2H, only two fins 20 are illustrated for simplicity.

Figure 2G:
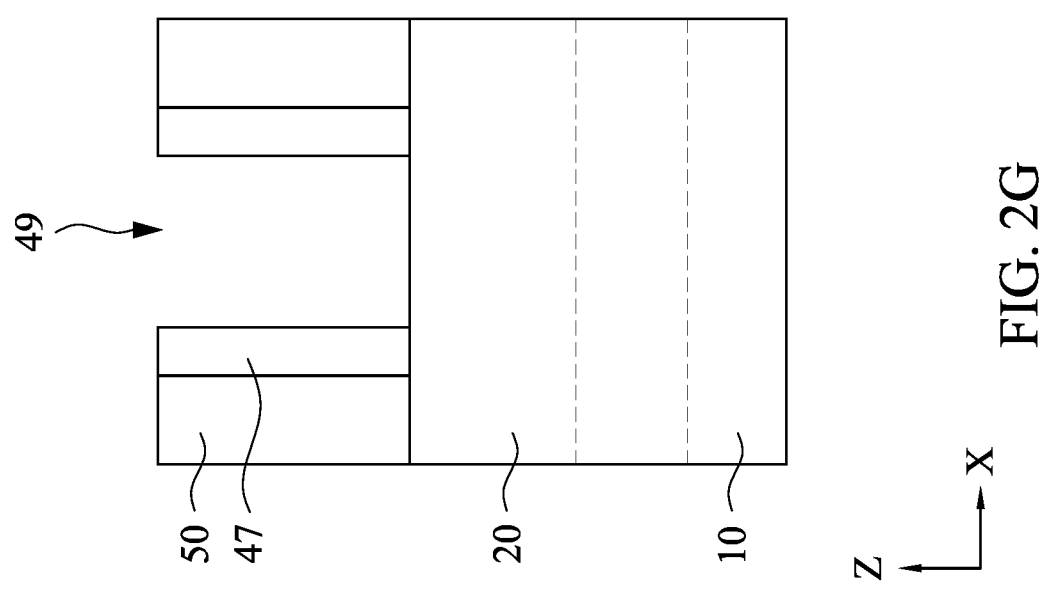

Then, as shown in FIGS. 2G and 2H, the sacrificial gate electrode layer 45 is removed, thereby forming a gate space 49. When the sacrificial gate electrode layer 45 is polysilicon and the ILD layer 50 is silicon oxide, a wet etchant such as a tetramethylammonium hydroxide (TMAH) solution is used to selectively remove the sacrificial gate electrode layer in some embodiments. In some embodiments, the sacrificial gate dielectric layer is subsequently removed using a suitable etching operation. In some embodiments, as shown in FIG. 2G, a portion of the fin 20 below the gate space 49 which is between the source/drain regions of the fins 20 is selected and trimmed.

A gate stack 75 is subsequently formed in the gate space 49, as shown in FIGS. 3A-6. FIGS. 3A-6 are detailed cross section views of gate structures according to embodiments of the disclosure. The gate stack 75 includes a gate dielectric layer 80 formed over the channel region 70 of the fin structure 20. A plurality of oxygen absorbing layers 85 and first work function metal layers 90 are formed over the gate dielectric layer 80 in the gate space 49. In some embodiments, one or more second work function metal layers 95 are formed in the gate space. A gate electrode layer 100 is formed over the work function metal layers 90, 95 and the gate oxygen absorbing layers.

In some embodiments, the gate dielectric layer 80 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$ or other suitable high-k dielectric materials, and/or combinations thereof. High-k dielectric materials are materials that have a dielectric constant (k) greater than about 3.9 (i.e. —greater than silicon dioxide). The gate dielectric layer 80 may be formed by CVD, ALD or any suitable method. In one embodiment, the gate dielectric layer 80 is formed using a highly conformal deposition process such as ALD in order to ensure the formation of a gate dielectric layer having a uniform thickness around each channel layer. The thickness of the gate dielectric layer 80 is in a range from about 1 nm to about 100 nm in some embodiments.

In some embodiments, the oxygen absorbing layer 85 is made of one or more selected from the group consisting of Al, Y, Mg, Ti, Ta, and Si. The oxygen absorbing layer 85 may be formed by ALD, CVD, PVD, or any suitable method. The thickness of the oxygen absorbing layer ranges from about 0.1 nm to about 2 nm in some embodiments, and between about 0.2 nm to about 1.0 nm in other embodiments.

In some embodiments, the work function metal layers 90, 95 are made of a conductive material such as a single layer of TaN, TiN, WN, TiC, WCN, MoN, Co, TaSiN, TiAl, TiAlC, TaAl, TiAlN, and TaAlC or a multilayer of two or more of these materials. The work function metal layers 90, 95, may be formed by ALD, CVD, PVD, or any suitable method. For the n-channel FET, an aluminum containing layer, such as TiAl, TiAlC, TaAl, TiAlN, and/or TaAlC is used as an n-type WFM layer, and for the p-channel FET, one or more of TaN, TiN, WN, TiC, TaSiN, and/or Co is used as a p-type WFM layer, in some embodiments. The thickness of the work function metal layers range from about 0.2 nm to about 10 nm in some embodiments, and between about 0.5 nm to about 5 nm in other embodiments.

Figure 3A:
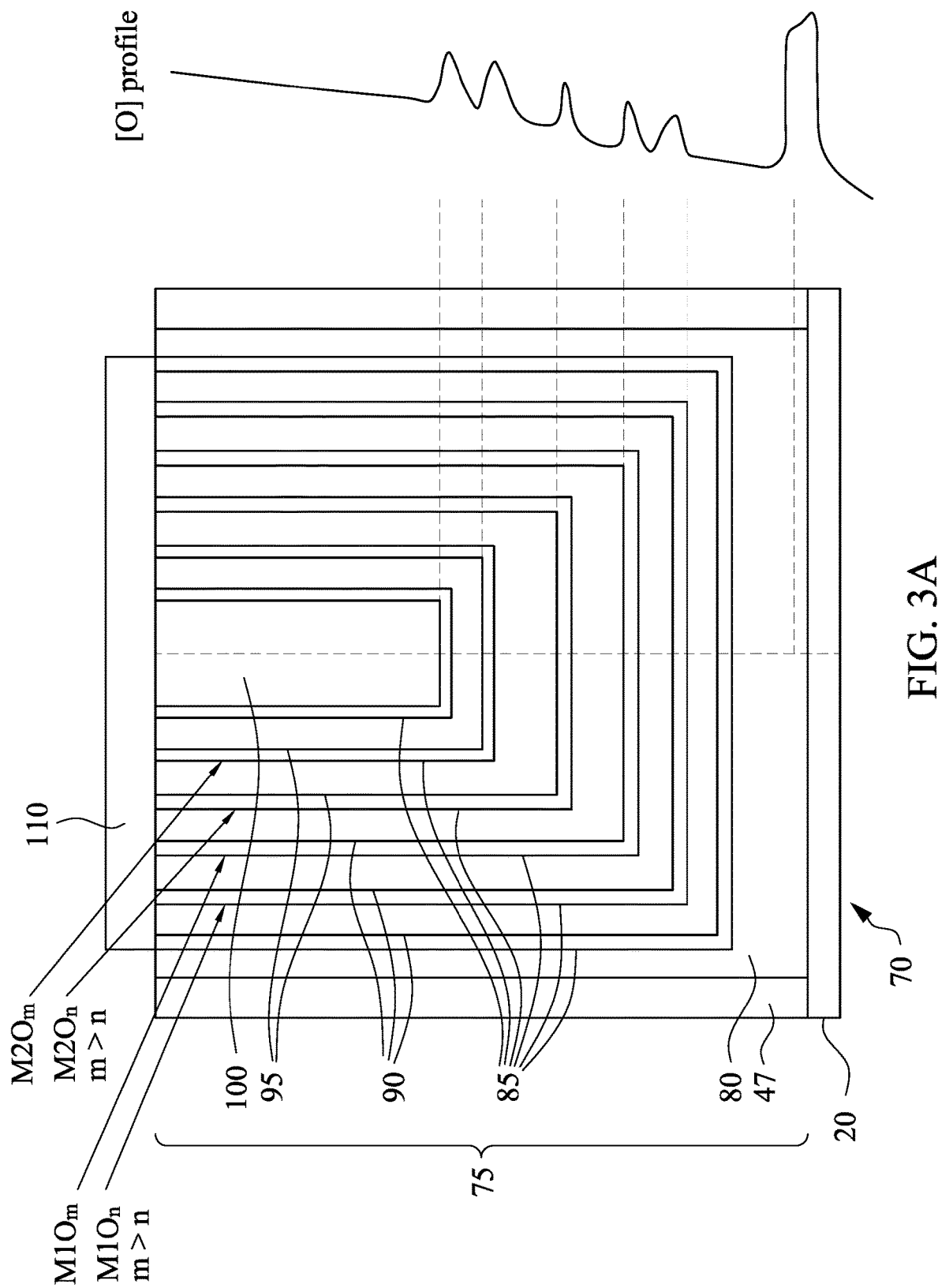
FIG. 3A is a detailed view of a gate structure according to embodiments of the disclosure.
Figure 3B:
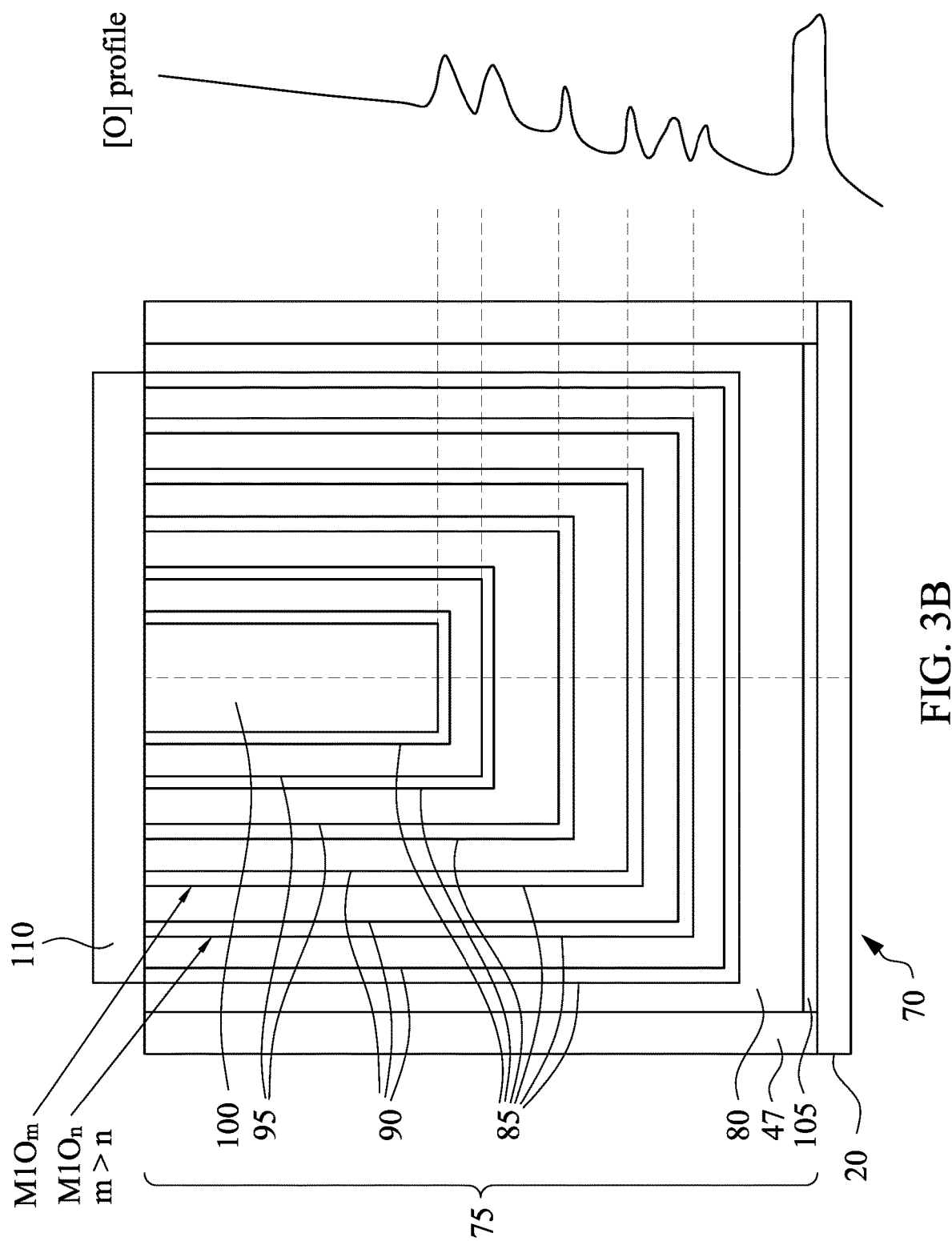
FIG. 3B is a detailed view of a gate structure according to embodiments of the disclosure.

As shown in FIGS. 3A and 3B, oxygen absorbing layers 85 are located between work function metal layers 90, 95 in some embodiments. In some embodiments, the oxygen absorbing layer 85 is disposed between each adjacent pair of work function metal layers 90, 95, and in other embodiments, an oxygen absorbing layer 85 is not formed between every pair of adjacent work function metal layers 90, 95. In some embodiments, an oxygen absorbing layer 85 is formed between the gate dielectric layer 80 and a work function metal layer 90, 95. In some embodiments, an oxygen absorbing layer 85 is formed directly on the gate dielectric layer 80. In some embodiments, an oxygen absorbing layer 85 is formed between the sidewall spacer layers 47 and a work function metal layer 90, 95.

In some embodiments, the gate stack structure includes two types of work function metal (WFM) layers, a first type WFM 90 used for forming p-type conductivity type structures and a second type WFM 95 used for forming n-type conductivity structures.

The semiconductor device may include p-type structures (i.e. —pFET) or n-type structures (i.e. —nFET). In some embodiments, a semiconductor device includes both pFET and nFET structures on the same substrate. In some embodiments, a pFET structure includes one or more first type work function metal (p-type WFM) layers disposed over gate dielectric layer and one or more second type work function metal (n-type WFM) layers disposed over the p-type WFM layers. In some embodiments, an nFET structure includes one or more n-type WFM layers disposed over gate dielectric layer and one or more p-type WFM layers disposed over the n-type WFM layers. The number of WFM layers may be selected to tune the threshold voltage $V_t$. For example, an ultra low voltage threshold (uLVT) device may only have one p-type WFM layer, while a low voltage threshold (LVT) device has two p-type WFM layers, and a standard voltage threshold (SVT) device may have three p-type WFM layers or a thicker p-type WFM layer.

A metal gate electrode layer 100 is formed over the WFM layers and fills the remaining open volume of the gate space 49. In some embodiments, the metal gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

A conductive contact 110 is formed over the gate stack structure 75, as shown in FIGS. 3A and 3B. The conductive contact 110 is an interconnect or an electrode in some embodiments. The conductive contact may connect the device to other devices or wiring in overlying layers of the device. In some embodiments, the conductive contact 110 is made of a metal, including aluminum, copper, tungsten, nickel, and alloys thereof. The conductive contact 110 is formed by PVD, CVD, or electroplating, in some embodiments.

Oxygen and moisture may be introduced into the gate electrode stack 75 after the formation of each layer; and during processes including aqueous solvents and ambient pressure, such as wet etching, and chemical mechanical polishing. Oxygen content is higher in the later formed layers, as shown in the oxygen [O] profile. Oxygen diffuses into the gate stack structure when the gate structure is exposed to ambient air. In addition, oxygen is driven into the gate stack structure 75 during processes, such as wet etching and chemical mechanical polishing (CMP), and at increased temperatures. The oxygen content rises at the interface between each oxygen absorbing layer 85 and WFM layer 90, 95, as the oxygen absorbing layer 85 preferentially reacts with oxygen compared to the WFM layers 90, 95. The [O] profile shows an increase at the gate dielectric layer 80 because the gate dielectric layer is an oxide in some embodiments.

In some embodiments, p-type WFM layers 90 are metal nitride layers, M1N, such as TiN layer. Oxygen that penetrates the gate stack structure 75 reacts with the metal nitride to form an oxide layers M1NO, such as TiNO, on the surface of the p-type metal nitride layers 90. As shown in FIG. 3A, the oxygen content is reduced on surfaces of the p-type WFM layer 90 nearer the sidewall spacer layers 47. The oxygen content of the oxide layer $M1NO_m$ is greater than the oxygen content of the oxide layer $M1NO_n$ (m>n) because of the intervening oxygen absorbing layers 85, that are more easily oxidized than the WFM layers 90, react with oxygen that is driven or diffused into the gate stack structure 75.

In some embodiments, the n-type WFM layers 95 are aluminum compound or alloy layers M2, such as a TiAl or TaAl layers. Oxygen that penetrates the gate stack structure reacts with the M2 layers to form an oxide layer M2O, such as TiAlO, on the surface of the n-type metal WFM layer 95. As shown in FIG. 3A, the oxygen content is reduced on surfaces of the n-type WFM layer 95 nearer the sidewall spacer layers 47. The oxygen content of the oxide layer $M2O_n$ further away from the gate electrode layer 100 is lower than the oxygen content of the oxide layer $M2O_m$ because of the intervening oxygen absorbing layers 85 that react with the oxygen that is driven or diffused into the gate stack structure 75.

The structure of FIG. 3B is similar to the structure of FIG. 3A, except the FIG. 3B structure includes an interfacial layer 105 formed over the channel region 70 before forming the gate dielectric layer 80. In some embodiments, the interfacial layer 105 is formed by using chemical oxidation. In some embodiments, the interfacial layer 105 includes one of silicon oxide, silicon nitride, and mixed silicon-germanium oxide. The thickness of the interfacial layer 105 is in a range from about 0.2 nm to about 6 nm in some embodiments.

Figure 4:
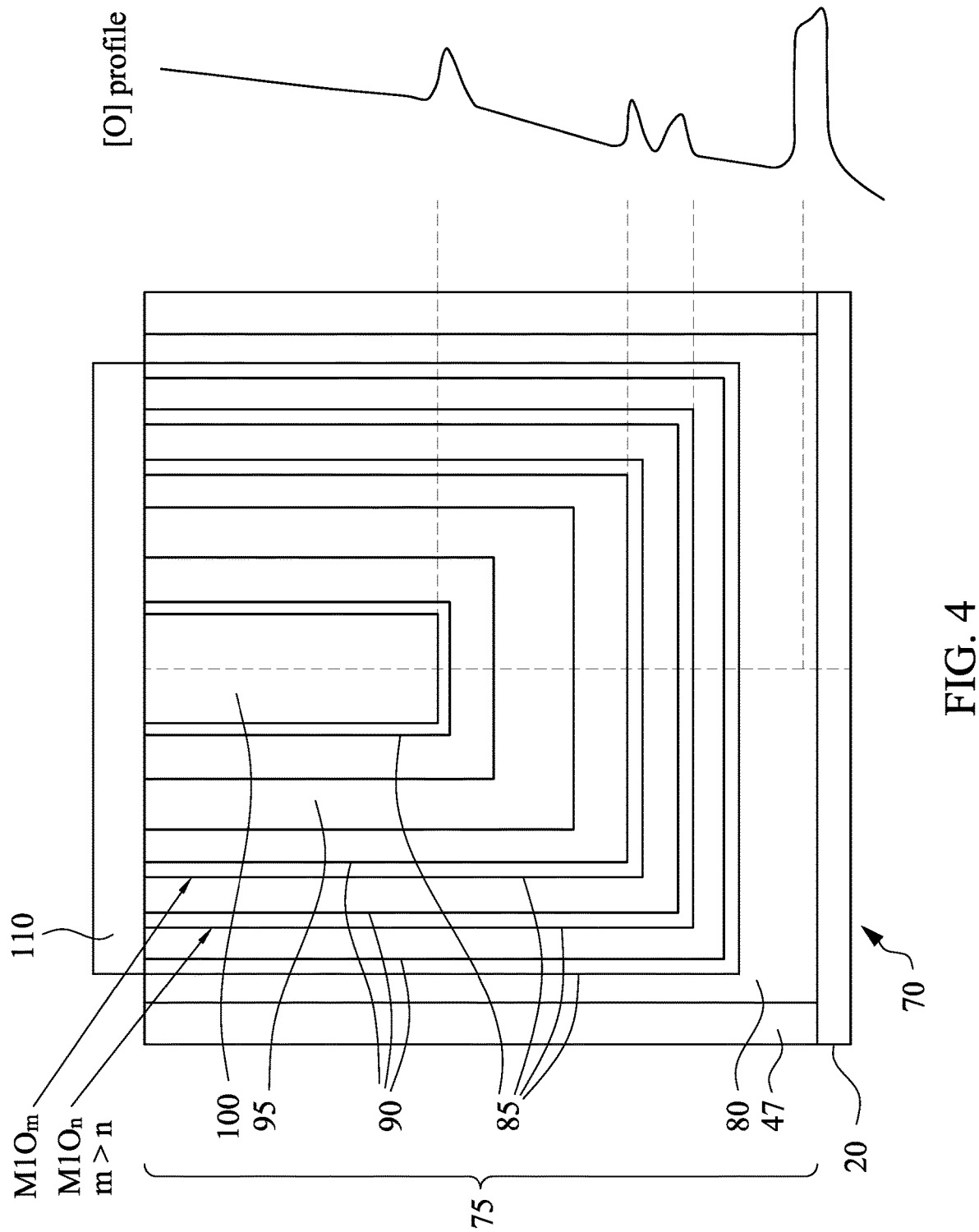
FIG. 4 is a detailed view of a gate structure according to embodiments of the disclosure.

An n-type WFM layer 95 is disposed between p-type WFM layers 90 in some embodiments, as shown in FIG. 4. In some embodiments, a plurality of alternating oxygen absorbing layers 85 and p-type WFM layers are formed over the gate dielectric layer 80. An n-type WFM layer 95 is formed over the p-type WFM layers 90, and then another p-type WFM layer 90 is formed over the n-type WFM layer 95, another oxygen absorbing layer 85 is formed over the another p-type WFM layer 90, and a metal gate electrode layer 100 is subsequently formed over the another p-type WFM layer 90. In some embodiments, no oxygen absorbing layer 85 is formed between the p-type WFM layer 90 and the n-type WFM layer 95. In some embodiments, the n-type WFM layer and p-type WFM layers, as shown in FIG. 4 are reversed, and the gate stack structure 75 includes a plurality of n-type WFM layers, and p-type WFM layer disposed between two adjacent n-type WFM layers.

As shown in FIG. 4, the oxygen content is higher in the later formed layers, as shown in the oxygen [O] profile. The oxygen content rises at the interface between each oxygen absorbing layer 85 and WFM layer 90 as the oxygen absorbing layer 85 preferentially reacts with oxygen compared to the WFM layers 90.

In some embodiments, a plurality of alternating first metal nitride layers 90 and second metal nitride layers 85 are formed over a channel region 70 of the semiconductor device. The first and second metal nitride layers are formed of the same first metal. The second metal nitride layer 85 has a greater concentration of the first metal than the first metal nitride layer 90. Thus, the second metal nitride layer 85 is a first metal rich layer compared to the first metal nitride layer 90. In some embodiments, the first metal is titanium. For example, in some embodiments where the metal nitride is titanium nitride, the second titanium nitride layer 85 contains from about 3 at. % to about 30 at. % more titanium than the first titanium nitride layer 90.

In some embodiments, the first and second metal nitride layers are formed by a material deposition operation, including chemical vapor deposition (CVD) and atomic layer deposition (ALD), and the second metal nitride layer is formed by changing one or more deposition parameters used to form the first metal nitride layer. In some embodiments, the deposition parameters are one or more selected from the group consisting of the concentration of metal nitride reactants, pressure, feed rate of the metal nitride reactants, and time duration of supplying the metal nitride reactants. For example, in some embodiments, the first and second metal nitride layers are TiN and the TiN is formed by an ALD process by the following reaction:

The Ti atomic concentration in the TiN is varied by adjusting the ratio of the $TiCl_4$ and $NH_3$ reactants, the pressure of the reactant gases, the flowrate of the $TiCl_4$ and $NH_3$ reactants, and duration of time the $TiCl_4$ and $NH_3$ reactants are supplied to the deposition chamber. Multiple alternating layers of TiN and Ti-rich TiN may be produced by supplying the $TiCl_4$ and $NH_3$ reactants at a first set of deposition parameters by ALD to form the first metal nitride layer, changing one or more of the deposition parameters to form several layers of Ti-rich TiN (the second metal nitride layer), and reverting the deposition parameters back to the first set of deposition parameters to form a second first metal nitride layer. These operations can be repeated to form the desired number of first metal nitride and second metal nitride layers to form the desired device (i.e. —uLVT, LVT, SVT, etc.).

The second metal nitride layer 85 functions as an oxygen absorbing layer and the first metal nitride layer is a WFM layer in some embodiments. In some embodiments, the first metal nitride layers are thicker than the second metal nitride layers. In some embodiments, an interfacial layer 105 is formed over the channel region 70 before forming the gate dielectric layer (see FIG. 3B).

Figure 5:
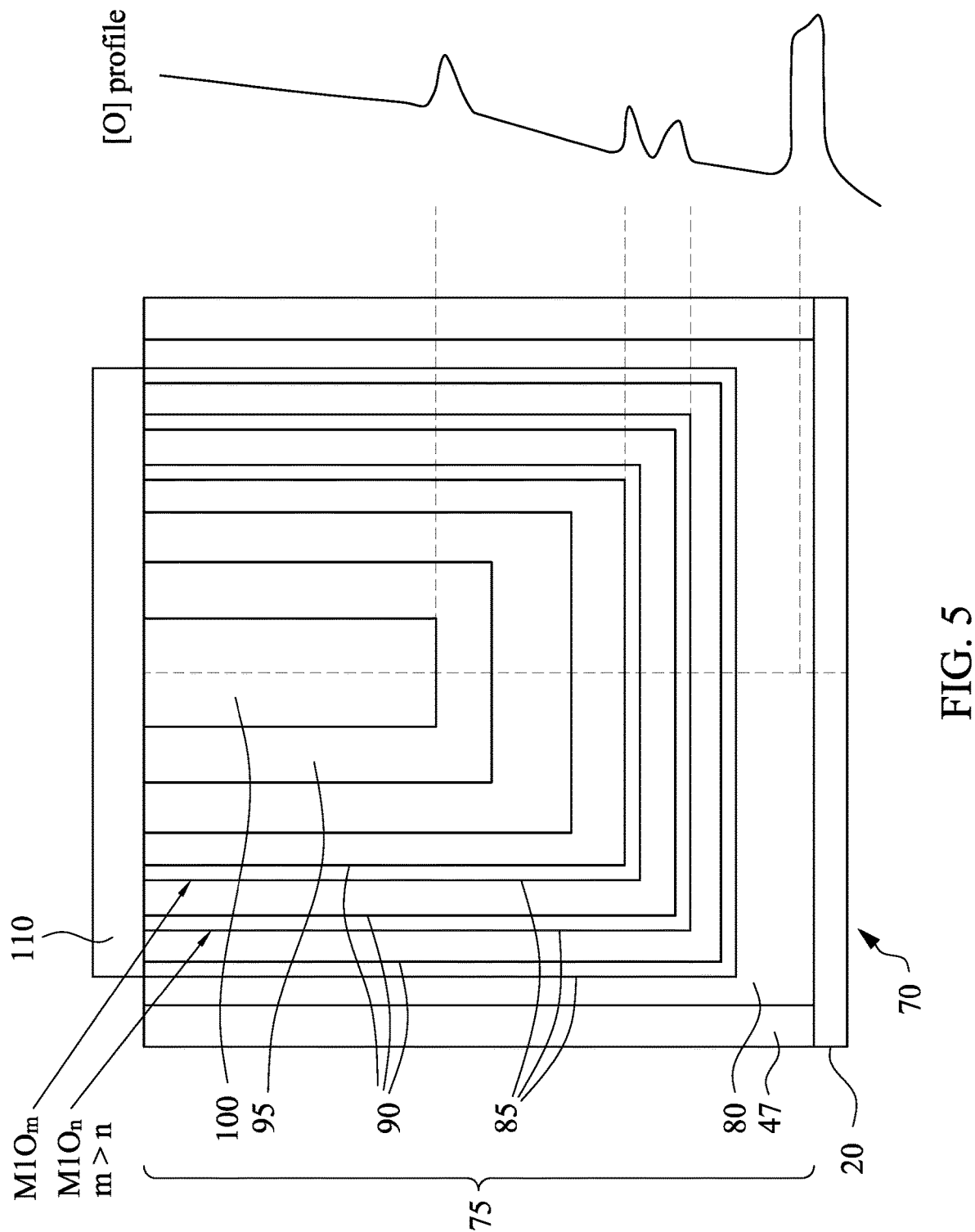
FIG. 5 is a detailed view of a gate structure according to embodiments of the disclosure.

In another embodiment, a plurality of alternating oxygen absorbing layers 85 and first type WFM layers 90 are formed over the gate dielectric layer 80, as shown in FIG. 5. A single second type WFM layer 95 is formed over the plurality of alternating oxygen absorbing layers 85 and first metal nitride layers 90, and a gate metal electrode layer 100 is subsequently formed over the second type WFM layer. In some embodiments, the first type WFM layer is a p-type WFM layer and the second type WFM layer is an n-type WFM layer. In some embodiments, the oxygen absorbing layer 85 is an elemental layer consisting of one selected from the group consisting of Ti, Ta, Si; and the first metal nitride layer 90 is a metal nitride layer selected from the group consisting of TiN, TaN, WN, MoN, and TaSiN. In some embodiments, the oxygen absorbing layer 85 is made of the same metal as the metal in the metal nitride layer 90.

As shown in FIG. 5, the oxygen content is higher in the later formed layers, as shown in the oxygen [O] profile. The oxygen content rises at the interface between each oxygen absorbing layer 85 and WFM layer 90 as the oxygen absorbing layer 85 preferentially reacts with oxygen compared to the WFM layers 90.

In some embodiments, the first type WFM layers 90 are thicker than the oxygen absorbing layers 85, and the second type WFM layer 95 is thicker than any of the individual first type WFM layers 90. In some embodiments, an interfacial layer 105 is formed over the channel region 70 before forming the gate dielectric layer (see FIG. 3B).

Figure 6:
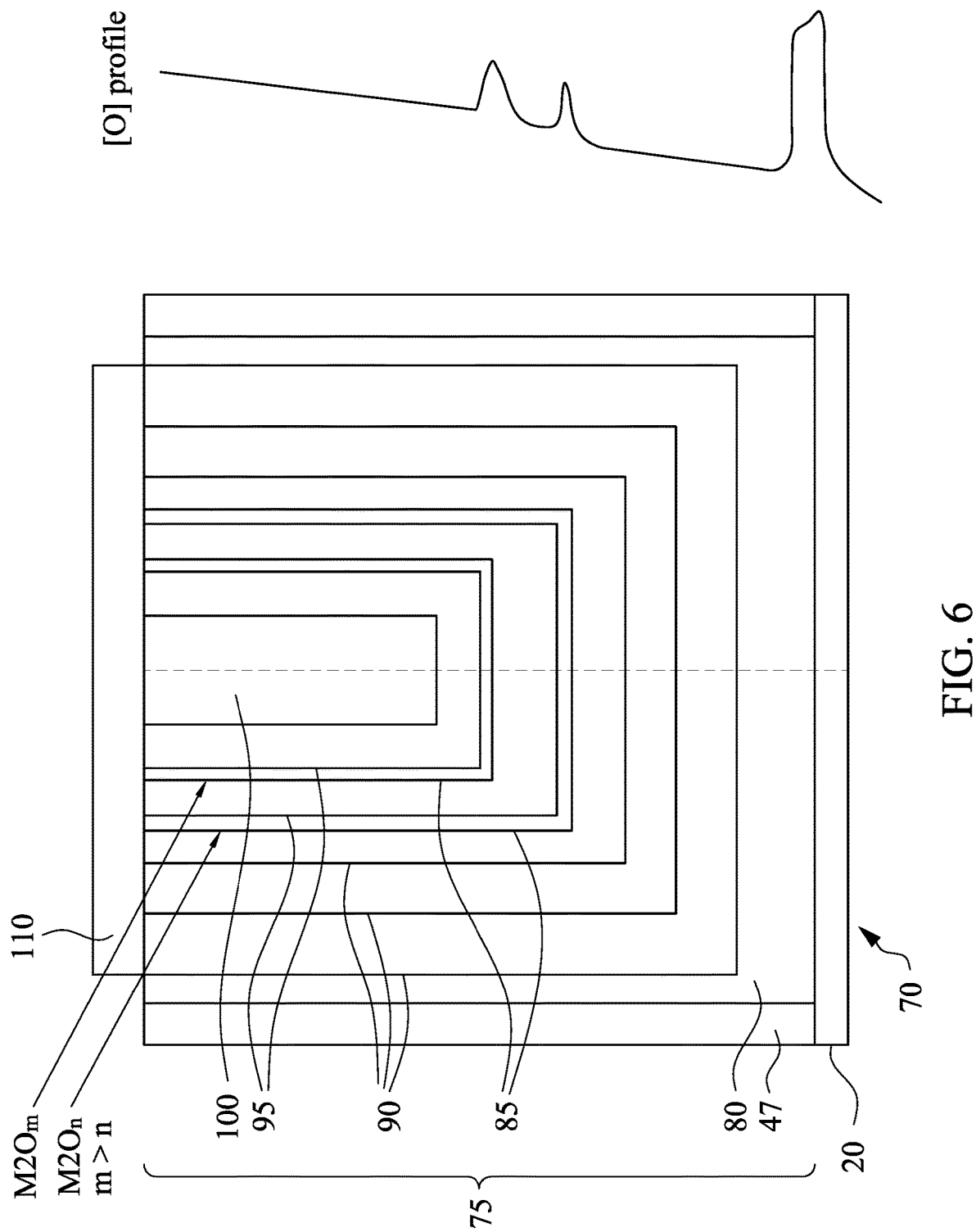
FIG. 6 is a detailed view of a gate structure according to embodiments of the disclosure.

In another embodiment, a plurality of first type WFM layers 90 are formed over the gate dielectric layer 80, as shown in FIG. 6. An oxygen absorbing layer 85 is formed over the plurality of first type WFM layers 90 and a second type WFM layers 95 are subsequently formed over the oxygen absorbing layer 85 overlying the plurality of first type WFM layers 90. In some embodiments, oxygen absorbing layers 85 are formed between adjacent second type WFM layers 95. A gate metal electrode layer 100 is subsequently formed over the second type WFM layers filling the remaining volume of the gate space 49. In some embodiments, the first type WFM layer is a p-type WFM layer, such as TiN or TaN; and the second type WFM layer is an n-type WFM layer, such as TiAl or TaAl. In some embodiments, the oxygen absorbing layer 85 is an elemental aluminum layer.

In some embodiments, the n-type WFM layers 95 are aluminum compound or alloy layers M2, such as a TiAl or TaAl layers. Oxygen that penetrates the gate stack structure reacts with the M2 layers to form an oxide layer M2O, such as TiAlO, on the surface of the n-type metal WFM layer 95. As shown in FIG. 6, the oxygen content is reduced on surfaces of the n-type WFM layer 95 nearer the sidewall spacer layers 47. The oxygen content of the oxide layer M2O$_n$ further away from the gate electrode layer 100 is lower than the oxygen content of the oxide layer M2O$_m$ because of the intervening oxygen absorbing layers 85 that react with oxygen that is driven or diffused into the gate stack structure 75.

As shown in FIG. 6, the oxygen content is higher in the later formed layers, as shown in the oxygen [O] profile. The oxygen content rises at the interface between each oxygen absorbing layer 85 and WFM layer 95 as the oxygen absorbing layer 85 preferentially reacts with oxygen compared to the WFM layers 95.

In some embodiments, the first type WFM layers 90 and second type WFM layers 95 are thicker than the oxygen absorbing layers 85. In some embodiments, an interfacial layer 105 is formed over the channel region 70 before forming the gate dielectric layer (see FIG. 3B).

FIGS. 7A, 7B, 7C, 7D, 7E and 7F show cross sectional views of various stages of a sequential manufacturing process of a semiconductor device according to embodiments of the present disclosure. It is understood that in the sequential manufacturing process, one or more additional operations can be provided before, during, and after the stages shown in FIGS. 7A-7F, and some of the operations described below can be replaced or eliminated for additional embodiments of the method. The order of the operations/processes may be interchangeable.

In some embodiments, a plurality of different types of transistors are formed over a semiconductor substrate. The different types of transistors may be formed at the same time by a series of photolithographic, deposition, and etching operations. The transistor manufacturing methods may include subtractive operations, where a series of deposition operations of different layers are performed followed by selectively removing layers from the various transistors; additive operations, where the different layers are selectively formed over the various transistor regions; or a combination of subtractive and additive operations.

Figure 7C:
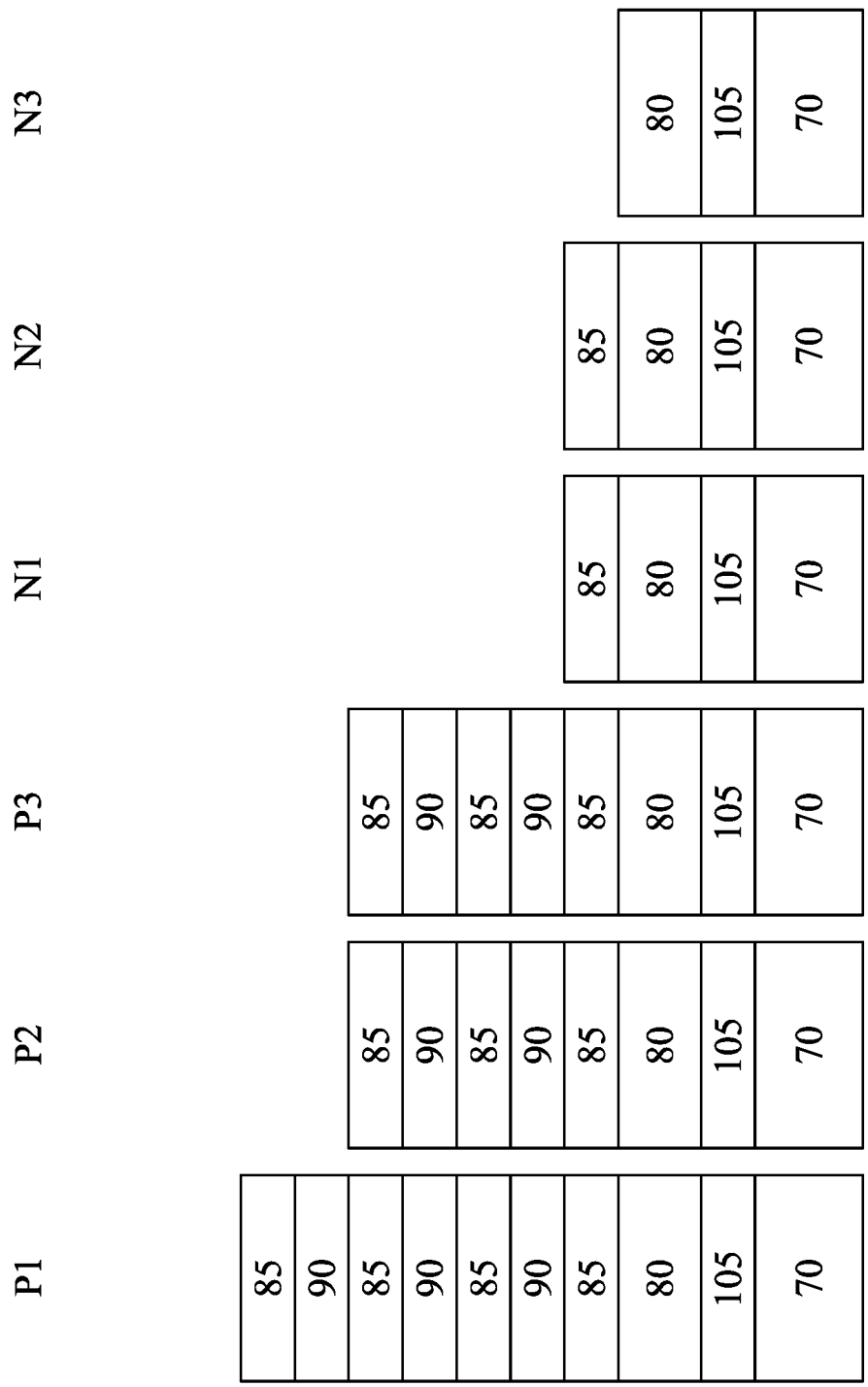

For example, as schematically shown in FIGS. 7A-7F, three different p-type FETS (P1, P2, and P3) and three different n-type FETS are formed over a common semiconductor substrate, such as a semiconductor wafer (not shown). The FETs are formed over the channel regions 70 of fin structures. As shown in FIG. 7A, an interfacial layer 105 is formed on each of the channel regions 70 of the first to third p-type FETs and n-type FETs. A gate dielectric layer (e.g., a high-k gate dielectric layer) 80 is formed on the interfacial layer 105. A first conductive layer, as a first barrier layer 83, is formed on the gate dielectric layer 80.

Next, as an oxygen absorbing layer 85 is formed over the n-type FETs and P-type FETs, and by using one or more photolithography and etching operations, the oxygen absorbing layer is removed from the n-type FETS. Then, a first p-type WFM layer 90 and a second oxygen absorbing layer is formed over the FETs. As shown in FIG. 7B, by using one or more photolithography and etching operations, the first p-type WFM layer and the second oxygen absorbing layer are removed from all but the P1 FET.

The p-type WFM layer 90 and oxygen absorbing layer 85 deposition and selective removal is repeated to form the desired numbers of p-type WFM layers and oxygen absorbing layers on the various FETs. For example, as shown in FIG. 7C, a third oxygen absorbing layer, second p-type WFM layer 90, fourth oxygen absorbing layer 85, and third p-type WFM layer are formed over the various FETS. Using one or more photolithography etching operations, one of the oxygen absorbing layers and both of the second and third p-type WFM layers are removed from N1 and N2, and both of the third and fourth oxygen absorbing layers and both of p-type WFM absorbing layers are removed from N1 in some embodiments.

Figure 7D:
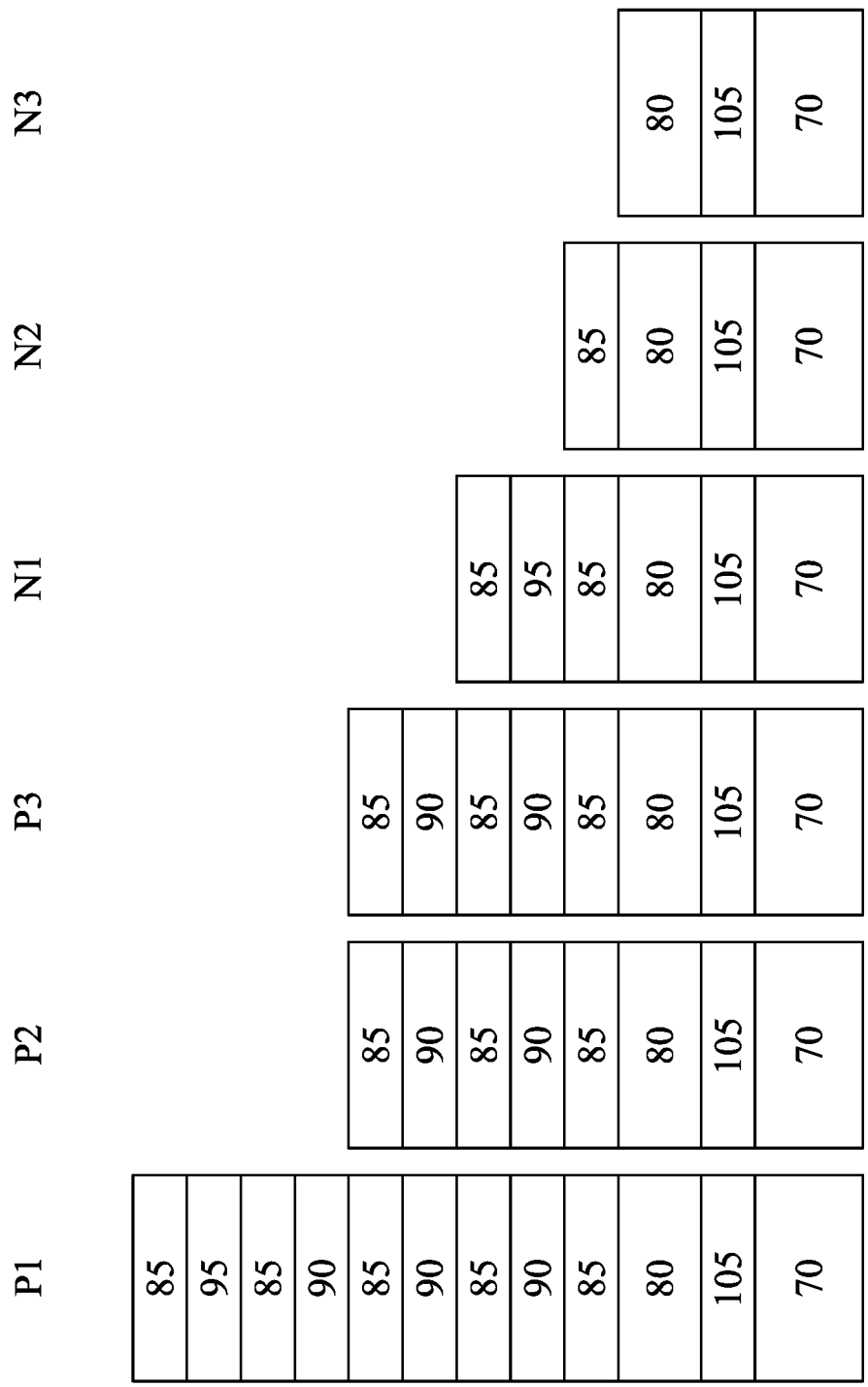

Then n-type WFM layers 95 are formed over P1 and N1, as shown in FIG. 7D. A first n-type WFM layer 95 and a fifth oxygen absorbing layer are formed over the FETs. Then, by using one or more photolithography etching operations, the first n-type WFM layers 95 and the fifth oxygen absorbing layers are removed from P2, P3, N2, and N3 in some embodiments.

Figure 7E:
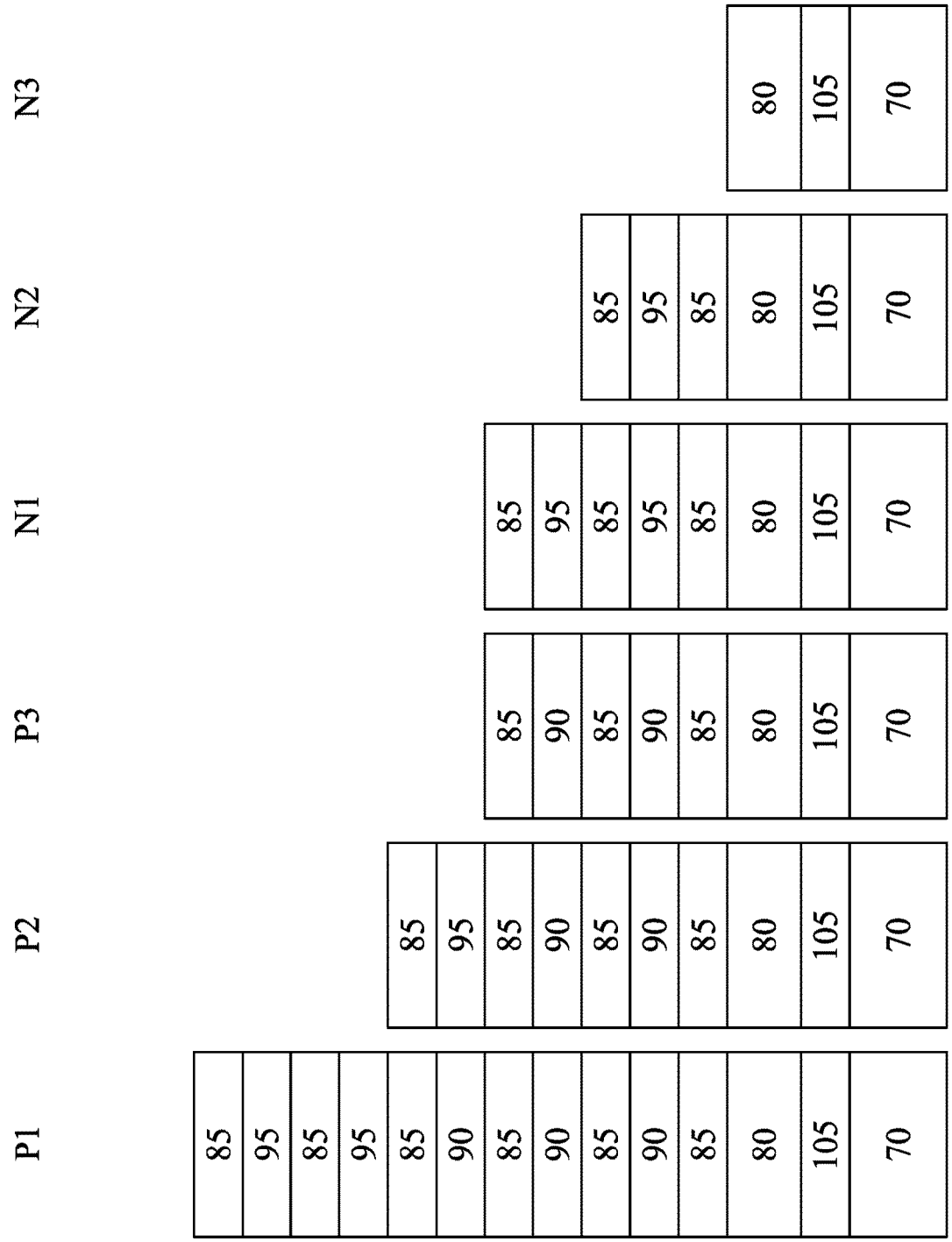
Figure 7F:
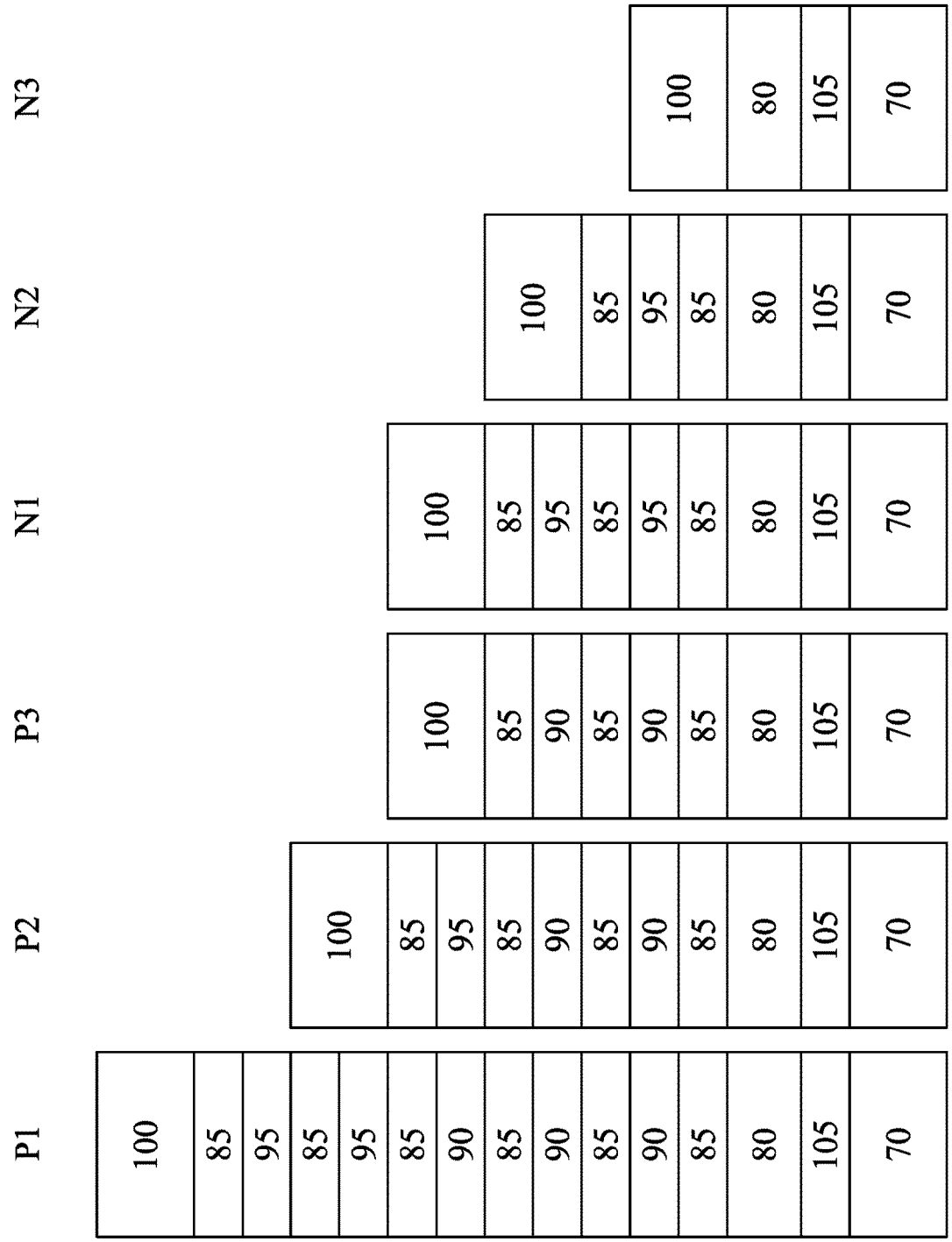

Then, a second n-type WFM layer 95 and a sixth oxygen absorbing layer are formed over the FETs, as shown in FIG. 7E. Then, by using one or more photolithography etching operations, the second n-type WFM layers 95 and the sixth oxygen absorbing layers are removed from P3 and N3 in some embodiments. A gate electrode layer 100 is subsequently formed on each of the FETs, as shown in FIG. 7F to provide various p and n type FETs having lower and higher threshold voltages VT on the same substrate.

Figure 8:
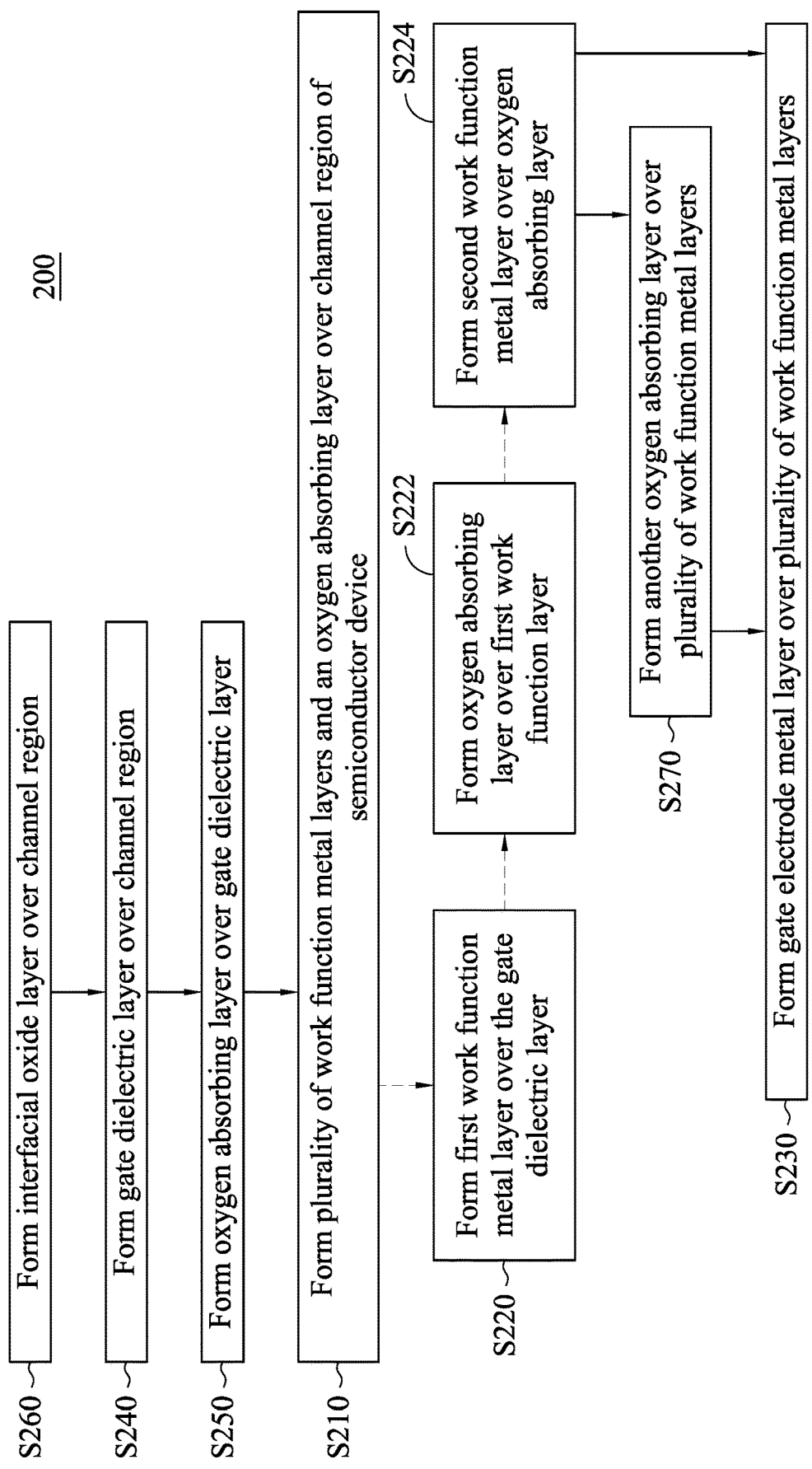
FIG. 8 illustrates a process flow of manufacturing a semiconductor device according to embodiments of the disclosure.

FIG. 8 illustrates a process flow of a method 200 of manufacturing a semiconductor device according to embodiments of the disclosure. In operation S210, a plurality of work function metal layers 90, 95 and an oxygen absorbing layer 85 are formed over a channel region 70 of the semiconductor device. The operation S210 of forming a plurality of work function metal layers includes an operation S220 of forming a first work function metal layer over the gate dielectric layer, an operation S222 of forming an oxygen absorbing layer 85 over the first work function metal layer 90, and an operation S224 of forming a second work function metal layer over the oxygen absorbing layer in operation S220. A gate electrode metal layer 100 is formed over the plurality of work function metal layers in operation S230. The work function metal layers 90, 95, oxygen absorbing layer 85, and gate electrode metal layer 100 are made of different materials. In some embodiments, the forming a plurality of work function layers in operation S210 includes forming a plurality of first type work function metal layers 90, and the forming an oxygen absorbing layer in operation S222 includes forming an oxygen absorbing layer 85 between each of the first type work function metal layers 90. In some embodiments, the forming a plurality of work function layers in operation S210 includes forming a plurality of second type work function metal layers 95, and the operation S222 of forming an oxygen absorbing layer includes forming an oxygen absorbing layer 85 between each of the second type work function metal layers 95.

In some embodiments, the method 200 includes an operation S240 of forming a gate dielectric layer 80 over the channel region 70 and an operation S250 of forming another oxygen absorbing layer 85 over the gate dielectric layer 80 before the operation S210 of forming the plurality of work function metal layers 90, 95 over the channel region 70 of the semiconductor device.

In some embodiments, the method 200 includes an operation S260 of forming an interfacial layer 105 over the channel region 70 before the operation S240 of forming the gate dielectric layer 80.

In some embodiments, the method 200 includes an operation S270 of forming another oxygen absorbing layer 85 over the plurality of work function metal layers 90, 95 before the operation S230 of forming the gate electrode metal layer 100.

Figure 9:
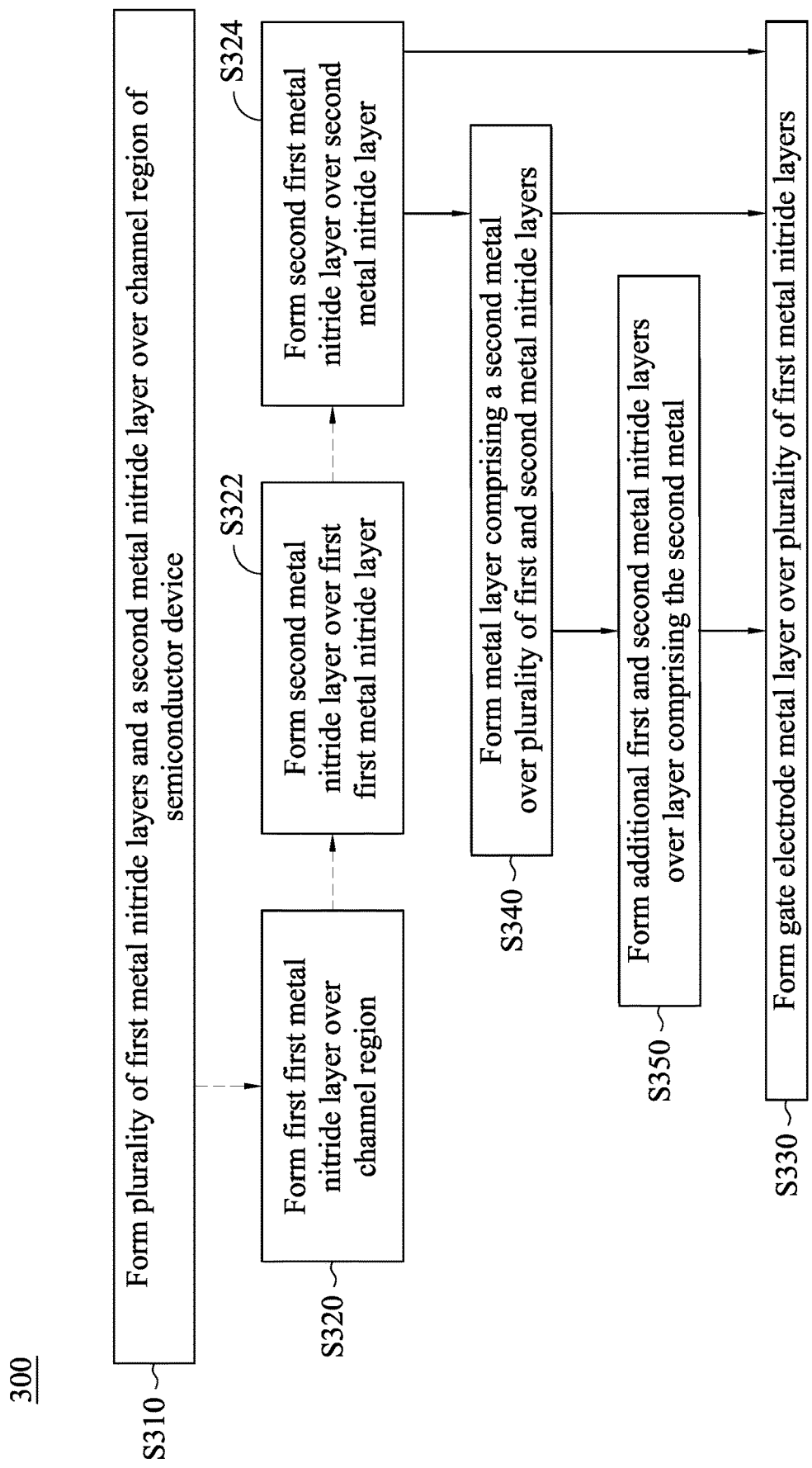
FIG. 9 illustrates a process flow of manufacturing a semiconductor device according to embodiments of the disclosure.

FIG. 9 illustrates a process flow of a method 300 of manufacturing a semiconductor device according to embodiments of the disclosure. In operation S310, a plurality of first metal nitride layers 90 and a second metal nitride layer 85 are formed over a channel region of the semiconductor device, wherein the first metal nitride layers 90 and the second metal nitride layer 85 include a first metal. The operation S310 of forming a plurality of first metal layers 90 and a second metal nitride layer 85 includes operation S320 of forming a first first metal nitride layer 90 over the channel region 70, operation S322 of forming a second metal nitride layer 85 over the first first metal nitride layer, and operation S324 of forming a second first metal nitride layer 90 over the second metal nitride layer 85. In operation S330, a gate electrode metal layer 100 is formed over the plurality of first metal nitride layers 90. The second metal nitride layer 85 has a greater concentration of the first metal than the first metal nitrides layer 90, and the first and second metal nitride layers 90, 85, and the gate electrode metal layer 100 are formed of different materials.

In some embodiments, the first and second metal nitride layers 90, 85 are formed by a material deposition operation, and the second metal nitride layer 85 is formed by changing one or more deposition parameters used to form the first metal nitride layer 90. In an embodiment, the deposition parameters are one or more selected from the group consisting of concentration of metal nitride reactants, pressure, feed rate of the metal nitride reactants, and time duration of supplying the metal nitride reactants.

In some embodiments, the method 300 includes an operation S340 of forming a metal layer 95 including a second metal over the first and second metal nitride layers 90, 85, wherein the second metal is different from the first metal.

In some embodiments, the method 300 includes an operation S350 of forming additional first and second metal nitride layers 90, 85 over the metal layer 95 including the second metal before the operation S330 of forming the gate metal electrode layer 100.

Figure 10:
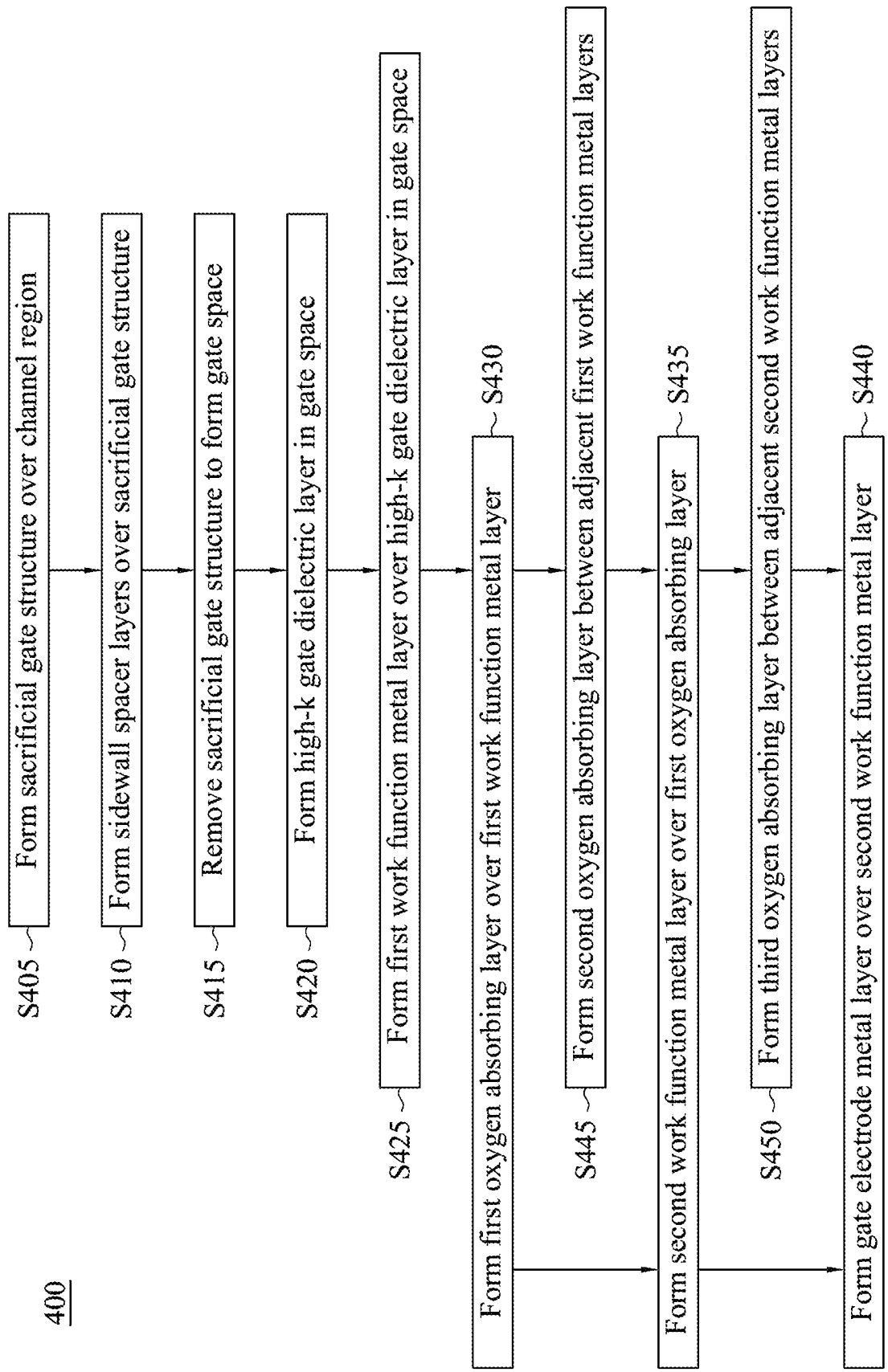
FIG. 10 illustrates a process flow of manufacturing a semiconductor device according to embodiments of the disclosure.

FIG. 10 illustrates a process flow of a method 400 of manufacturing a semiconductor device according to embodiments of the disclosure. In operation S405, a sacrificial gate structure 40 is formed over a channel region 70 of the semiconductor device. Sidewall spacer layers 47 are formed over sidewalls of the sacrificial gate structure 40 in operation S410. The sacrificial gate structure 40 is subsequently removed to form a gate space 49 in operation S415. A high-k gate dielectric layer 80 is the formed in the gate space 49 in operation S420. In operation S425, a first work function metal layer 90 is formed over the high-k gate dielectric layer 80 in the gate space 49. A first oxygen absorbing layer 85 is formed over the first work function metal layer 90 in operation S430. Then, a second work function metal layer 95 is formed over the first oxygen absorbing layer 85 in operation S435. Next, in operation S440, a gate electrode metal layer 100 is formed over the second work function metal layer 95. The first work function metal layer, second work function metal layer, oxygen absorbing layer, and gate electrode metal layer are formed of different materials.

In some embodiments, the method 400 includes an operation S445 of forming a second oxygen absorbing layer 85 between adjacent first work function metal layers 90.

In some embodiments, the method 400 includes an operation S450 of forming a third oxygen absorbing layer 85 between adjacent second work function metal layers 95.

Oxidation of gate stack structures of semiconductor devices is inhibited by embodiments of the present disclosure. Embodiments of the disclosure inhibit growth and thickening of the gate dielectric and interfacial layers during subsequent semiconductor processing and thereby inhibits device performance deterioration. The disclosed embodiments also prevent oxidation of work function metal layers in the gate stack structure. Therefore, the disclosed embodiments prevent an increase in gate stack structure resistance and maintains excellent device performance characteristics, such as flat band voltage. The oxygen absorbing layers according to embodiments of the disclosure capture oxygen and prevents the captured oxygen from further oxidizing the gate dielectric and interfacial layers.

It will be understood that not all advantages have been necessarily discussed herein, no particular advantage is required for all embodiments or examples, and other embodiments, or examples may offer different advantages.

An embodiment of the disclosure is a method of manufacturing a semiconductor device, including forming a plurality of work function metal layers and an oxygen absorbing layer over a channel region of the semiconductor device, including forming a first work function metal layer over the channel region, forming an oxygen absorbing layer over the first work function metal layer, forming a second work function metal layer over the oxygen absorbing layer. A gate electrode metal layer is formed over the plurality of work function metal layers. The work function metal layers, oxygen absorbing layer, and gate electrode metal layer are made of different materials. In an embodiment, the oxygen absorbing layer is made of one or more selected from the group consisting of Al, Y, Mg, Ti, Ta, and Si. In an embodiment, the plurality of work function metal layers include a first type work function metal layer and a second type work function metal layer, and the first type work function metal layer and the second type work function metal layer are made of different materials. In an embodiment, the first type work function metal layer is a p-type work function metal layer and the second type work function metal layer is an n-type work function metal layer. In an embodiment, the first type work function metal layer is made of one or more selected from the group consisting of TaN, TiN, WN, TiC, WCN, TaSiN, MoN, and Co. In an embodiment, the second type work function metal layer is made of one or more selected from the group consisting of TiAl, TiAlC, TaAl, TiAlN, and TaAlC. In an embodiment, the forming a plurality of work function layers includes forming a plurality of the first type work function metal layers, and the forming an oxygen absorbing layer includes forming an oxygen absorbing layer between each of the first type work function metal layers. In an embodiment, the forming a plurality of work function layers includes forming a plurality of the second type work function metal layers, and the forming an oxygen absorbing layer includes forming an oxygen absorbing layer between each of the second type work function metal layers. In an embodiment, the method includes forming a gate dielectric layer over the channel region and forming another oxygen absorbing layer over the gate dielectric layer before forming the plurality of work function metal layers over the channel region of the semiconductor device. In an embodiment, the method includes forming an interfacial layer over the channel region before forming the gate dielectric layer. In an embodiment, the method includes forming another oxygen absorbing layer over the plurality of work function metal layers before forming the gate electrode metal layer.

Another embodiment of the disclosure is a method of manufacturing a semiconductor device, including forming a plurality of first metal nitride layers and a second metal nitride layer over a channel region of the semiconductor device, wherein the first metal nitride layers and the second metal nitride layer include a first metal, including forming a first first metal nitride layer over the channel region, forming a second metal nitride layer over the first first metal nitride layer, and forming a second first metal nitride layer over the second metal nitride layer. A gate electrode metal layer is formed over the plurality of first metal nitride layers. The second metal nitride layer has a greater concentration of the first metal than the first metal nitride layers, and the first and second metal nitride layers, and the gate electrode metal layer are formed of different materials. In an embodiment, the first metal nitride layers are thicker than the second metal nitride layers. In an embodiment, the first and second metal nitride layers are formed by a material deposition operation, and the second metal nitride layer is formed by changing one or more deposition parameters used to form the first metal nitride layers. In an embodiment, the deposition parameters are one or more selected from the group consisting of concentration of metal nitride reactants, pressure, feed rate of the metal nitride reactants, and time duration of supplying the metal nitride reactants. In an embodiment, the method includes forming a metal layer including a second metal over the first and second metal nitride layers, wherein the second metal is different from the first metal. In an embodiment, the method includes forming additional first and second metal nitride layers over the metal layer including the second metal before forming the gate metal electrode layer.

Another embodiment of the disclosure is a semiconductor device, including a gate stack structure disposed over a channel region of semiconductor substrate. The gate stack structure includes a plurality of work function metal layers, an oxygen absorbing layer disposed between a pair of the work function metal layers, and a gate electrode metal layer disposed over the plurality of work function metal layers. The work function metal layers, oxygen absorbing layer, and gate electrode metal layer are different materials. In an embodiment, the gate stack structure is formed over a fin structure protruding from the semiconductor substrate. In an embodiment, the gate stack structure includes a gate dielectric layer disposed between the work function metal layers and the semiconductor substrate. In an embodiment, the oxygen absorbing layer includes one or more selected from the group consisting of Al, Y, Mg, Ti, Ta, and Si. In an embodiment, the plurality of work function metal layers include a first work function metal layer and a second work function metal layer, and the first work function metal layer and the second work function metal layer are made of different materials. In an embodiment, the first work function metal layer is a p-type work function metal layer and the second work function metal layer is an n-type work function metal layer. In an embodiment, the first work function metal layer is made of one or more selected from the group consisting of TaN, TiN, WN, TiC, WCN, TaSiN, MoN, and Co. In an embodiment, the second work function metal layer is made of one or more selected from the group consisting of TiAl, TiAlC, TiAlN, TaAl, and TaAlC. In an embodiment, the semiconductor device includes a plurality of first work function metal layers, and an oxygen absorbing layer disposed between each of the first work function metal layers. In an embodiment, the semiconductor device includes a plurality of second work function metal layers, and an oxygen absorbing layer disposed between each of the second work function metal layers. In an embodiment, the semiconductor device includes an oxygen absorbing layer disposed between the gate dielectric layer and the plurality of work function metal layers. In an embodiment, the semiconductor device includes an interfacial layer disposed between the channel region and the gate dielectric layer. In an embodiment, the semiconductor device includes an oxygen absorbing layer disposed between the plurality of work function metal layers and the gate electrode metal layer. In an embodiment, each of the work function metal layers have a thickness greater than a thickness of an adjacent oxygen absorbing layer. In an embodiment, the semiconductor device includes sidewall spacers disposed over sidewalls of the gate stack structure, and an additional oxygen absorbing layer disposed between the sidewall spacers and the plurality of work function metal layers. In an embodiment, the gate structure includes a gate dielectric layer disposed between the plurality of work function metal layers and the channel region and the gate dielectric layer extends between the sidewall spacers and the additional oxygen absorbing layer.

Another embodiment of the disclosure is a semiconductor device, including a plurality of first metal nitride layers disposed over a channel region of the semiconductor device. A second metal nitride layer is disposed between a pair of the first metal nitride layers, and a gate electrode metal layer is disposed over the plurality of first metal nitride layers. The first metal nitride layers and the second metal nitride layer include a first metal, wherein the second metal nitride layer has a greater concentration of the first metal than the first metal nitride layer. The first and second metal nitride layers, and the gate electrode metal layer are different materials. In an embodiment, the first metal nitride layers are thicker than the second metal nitride layers. In an embodiment, the semiconductor device includes a metal layer formed of second metal disposed over the first and second metal nitride layers, wherein the second metal is a different metal than the first metal. In an embodiment, the first metal nitride layer is a p-type work function metal layer and the metal layer formed of the second metal is an n-type work function metal layer. In an embodiment, the second metal is selected from the group consisting of TiAl, TiAlC, TiAlN, TaAl, and TaAlC. In an embodiment, the first metal nitride layer is made of one or more selected from the group consisting of TaN, TiN, TaSiN, WN, WCN, and MoN. In an embodiment, the semiconductor device includes additional first and second metal nitride layers disposed between the metal layer formed of the second metal and the gate metal electrode layer.

Another embodiment of the disclosure is a semiconductor device, including a gate stack structure disposed over a channel region of semiconductor substrate. The gate stack structure includes a first work function metal layer, and a second work function layer disposed over the first work function metal layer. A first oxygen absorbing layer is disposed between the first work function metal layer and the second work function metal layer. A gate electrode metal layer is disposed over the second work function metal layer. The first and second work function metal layers, oxygen absorbing layer, and gate electrode metal layer are made of different materials. In an embodiment, the oxygen absorbing layer is a single metal element layer formed of a single metal element. In an embodiment, the single metal element is selected from the group consisting of Al, Y, Mg, Ti, Ta, and Si. In an embodiment, the first work function metal layer includes a plurality of first work function metal layers, and the single element layer is not located between adjacent first work function metal layers. In an embodiment, the second work function metal layer includes a plurality of spaced apart second work function metal layers, and another oxygen absorbing layer is disposed between each of the spaced apart second work function metal layers. In an embodiment, the gate stack structure is formed over a fin structure protruding from the semiconductor substrate. In an embodiment, the gate stack structure includes a gate dielectric layer disposed between the first and second work function metal layers and the semiconductor substrate.

Another embodiment of the disclosure includes a semiconductor device including a gate stack structure disposed over a channel region of semiconductor substrate. The gate stack structure includes a plurality of first work function metal layers, and a second work function layer disposed over the plurality of first work function metal layers. A first oxygen absorbing layer is disposed between adjacent first work function metal layers, and a gate electrode metal layer is disposed over the second work function metal layer. The first and second work function metal layers, oxygen absorbing layer, and gate electrode metal layer are made of different materials. In an embodiment, the first oxygen absorbing layer is a single metal element layer formed of a single metal element. In an embodiment, the single metal element is selected from the group consisting of Al, Y, Mg, Ti, Ta, and Si. In an embodiment, the single element layer is not located between the second work function metal layer and an immediately adjacent first work function metal layer. In an embodiment, the second work function metal layer includes a plurality of second work function metal layers. In an embodiment, the gate stack structure is formed over a fin structure protruding from the semiconductor substrate. In an embodiment, the gate stack structure includes a gate dielectric layer disposed between the plurality of first work function metal layers and the semiconductor substrate. In an embodiment, the first work function metal layer is a p-type work function metal layer and the second work function metal layer is an n-type work function metal layer. In an embodiment, the first work function metal layer is made of one or more selected from the group consisting of TaN, TiN, TaSiN, WN, TiC, WCN, MoN, and Co. In an embodiment, the second work function metal layer is made of one or more selected from the group consisting of TiAl, TiAlC, TiAlN, TaAl, and TaAlC.

Another embodiment of the disclosure is a method of manufacturing a semiconductor device, including forming a sacrificial gate structure over a channel region of the semiconductor device, and forming sidewall spacer layers over sidewalls of the sacrificial gate structure. The sacrificial gate structure is removed to form a gate space, and a high-k gate dielectric layer is formed in the gate space. A first work function metal layer is formed over the high-k gate dielectric layer in the gate space, and a first oxygen absorbing layer is formed over the first work function metal layer. A second work function metal layer is formed over the first oxygen absorbing layer, and a gate electrode metal layer is formed over the second work function metal layer. The first work function metal layer, second work function metal layer, oxygen absorbing layer, and gate electrode metal layer are formed of different materials. In an embodiment, the first work function metal layer and the second work function metal layer have thicknesses greater than a thickness of the first oxygen absorbing layer. In an embodiment, the first work function metal layer includes a plurality of first work function metal layers. In an embodiment, the method includes forming a second oxygen absorbing layer between adjacent first work function metal layers. In an embodiment, the first oxygen absorbing layer and the second oxygen absorbing layer are made of a same material. In an embodiment, the first work function metal layers have thicknesses greater than a thickness of the second oxygen absorbing layer. In an embodiment, the second work function metal layer includes a plurality of second work function metal layers. In an embodiment, the method includes forming a third oxygen absorbing layer between adjacent second work function metal layers. In an embodiment, the first oxygen absorbing layer and the third oxygen absorbing layer are made of a same material. In an embodiment, the second work function metal layers have thicknesses greater than a thickness of third oxygen absorbing layer. In an embodiment, the first work function metal layer is made of one or more selected from the group consisting of TaN, TiN, TaSiN, WN, TiC, WCN, MoN, and Co. In an embodiment, the second work function metal layer is made of one or more selected from the group consisting of TiAl, TiAlC, TiAlN, TaAl, and TaAlC. In an embodiment, the first oxygen absorbing layer and the second oxygen absorbing layer are made of an element selected from the group consisting of Al, Y, Mg, Ti, Ta, and Si. In an embodiment, the first oxygen absorbing layer and the third oxygen absorbing layer are made of an element selected from the group consisting of Al, Y, Mg, Ti, Ta, and Si.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a plurality of work function metal layers and an oxygen absorbing layer over a channel region of the semiconductor device, comprising:
        forming a first work function metal layer over the channel region;
        forming an oxygen absorbing layer over the first work function metal layer; and
        forming a second work function metal layer over the oxygen absorbing layer;
    forming a gate electrode metal layer over the plurality of work function metal layers,
    wherein the work function metal layers, oxygen absorbing layer, and gate electrode metal layer are made of different materials; and
    forming a gate dielectric layer over the channel region; and
    forming another oxygen absorbing layer over the gate dielectric layer before forming the plurality of work function metal layers over the channel region of the semiconductor device.

2. The method according to claim 1, wherein the oxygen absorbing layer is made of one or more selected from the group consisting of Al, Y, Mg, Ti, Ta, and Si.

3. The method according to claim 1, wherein the plurality of work function metal layers include a first type work function metal layer and a second type work function metal layer, and the first type work function metal layer and the second type work function metal layer are made of different materials.

4. The method according to claim 3, wherein the first type work function metal layer is a p-type work function metal layer and the second type work function metal layer is an n-type work function metal layer.

5. The method according to claim 3, wherein the first type work function metal layer is made of one or more selected from the group consisting of TaN, TiN, TaSiN, WN, TiC, WCN, MoN, and Co.

6. The method according claim 3, wherein the second type work function metal layer is made of one or more selected from the group consisting of TiAl, TiAlC, TiAlN, TaAl, and TaAlC.

7. The method according to claim 3, wherein:
    the forming a plurality of work function layers includes forming a plurality of the first type work function metal layers; and
    wherein the forming an oxygen absorbing layer includes forming an oxygen absorbing layer between each of the first type work function metal layers.

8. The method according to claim 3, wherein:
    the forming a plurality of work function layers includes forming a plurality of the second type work function metal layers; and
    wherein the forming an oxygen absorbing layer includes forming an oxygen absorbing layer between each of the second type work function metal layers.

9. A method of manufacturing a semiconductor device, comprising:
    forming a plurality of first metal nitride layers and a second metal nitride layer over a channel region of the semiconductor device, wherein the first metal nitride layers and the second metal nitride layer comprise a first metal, comprising:
        forming a first first metal nitride layer over the channel region;
        forming the second metal nitride layer over the first first metal nitride layer; and
        forming a second first metal nitride layer over the second metal nitride layer; and
    forming a gate electrode metal layer over the plurality of first metal nitride layers,
    wherein the second metal nitride layer has a greater concentration of the first metal than the first metal nitride layer, and
    the first and second metal nitride layers, and the gate electrode metal layer are formed of different materials.

10. The method according to claim 9, wherein the first metal nitride layers are thicker than the second metal nitride layers.

11. The method according to claim 9, wherein the first and second metal nitride layers are formed by a material deposition operation, and the second metal nitride layer is formed by changing one or more deposition parameters used to form the first metal nitride layers.

12. The method according to claim 11, where the deposition parameters are one or more selected from the group consisting of concentration of metal nitride reactants, pressure, feed rate of the metal nitride reactants, and time duration of supplying the metal nitride reactants.

13. The method according to claim 9, further comprising forming a metal layer comprising a second metal over the first and second metal nitride layers, wherein the second metal is different from the first metal.

14. The method according to claim 13, further comprising forming additional first and second metal nitride layers over the metal layer comprising the second metal before forming the gate metal electrode layer.

15. A semiconductor device, comprising:
    a gate stack structure disposed over a channel region of semiconductor substrate,
    wherein the gate stack structure comprises:
        a gate dielectric layer disposed over the channel region;
        a first oxygen absorbing layer disposed over the gate dielectric layer;
        a plurality of work function metal layers disposed over the first oxygen absorbing layer;
        a second oxygen absorbing layer disposed between a pair of the work function metal layers; and
        a gate electrode metal layer disposed over the plurality of work function metal layers,
        wherein the work function metal layers, oxygen absorbing layers, and gate electrode metal layer are different materials.

16. The semiconductor device of claim 15, wherein the gate stack structure is formed over a fin structure protruding from the semiconductor substrate.

17. The semiconductor device of claim 15, wherein the oxygen absorbing layer comprises one or more selected from the group consisting of Al, Y, Mg, Ti, Ta, and Si.

18. The semiconductor device of claim 15, wherein the plurality of work function metal layers include a first work function metal layer and a second work function metal layer, and the first work function metal layer and the second work function metal layer are made of different materials.

19. The semiconductor device of claim 18, further comprising an oxygen absorbing layer between each of the first type work function metal layers.

20. The method according to claim 18, further comprising an oxygen absorbing layer between each of the second type work function metal layers.

* * * * *